(12) United States Patent
Yamaguchi et al.

(10) Patent No.: US 7,473,377 B2
(45) Date of Patent: Jan. 6, 2009

(54) PLASMA PROCESSING METHOD

(75) Inventors: Tomoyo Yamaguchi, Nirasaki (JP);
Takashi Fuse, Nirasaki (JP); Kiwamu Fujimoto, Nirasaki (JP); Masanobu Honda, Nirasaki (JP); Kazuya Nagaseki, Nirasaki (JP); Akiteru Koh, Nirasaki (JP); Takashi Enomoto, Beverly, MA (US); Hiroharu Ito, Nirasaki (JP); Akinori Kitamura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 617 days.

(21) Appl. No.: 10/959,152

(22) Filed: Oct. 7, 2004

(65) Prior Publication Data

US 2005/0103748 A1    May 19, 2005

Related U.S. Application Data

(63) Continuation-in-part of application No. 10/607,537, filed on Jun. 27, 2003, now abandoned.

(60) Provisional application No. 60/423,566, filed on Nov. 5, 2002, provisional application No. 60/420,788, filed on Oct. 24, 2002.

(30) Foreign Application Priority Data

| Jun. 27, 2002 | (JP) | ............................. | 2002-187422 |
| Jul. 24, 2002 | (JP) | ............................. | 2002-214628 |
| Sep. 18, 2002 | (JP) | ............................. | 2002-271588 |
| Sep. 18, 2002 | (JP) | ............................. | 2002-271589 |
| Jan. 9, 2003 | (JP) | ............................. | 2003-003540 |
| Apr. 15, 2003 | (JP) | ............................. | 2003-110225 |
| May 28, 2003 | (JP) | ............................. | 2003-151416 |

(51) Int. Cl.
*B44C 1/22* (2006.01)

(52) U.S. Cl. .............................. 216/22; 216/49; 216/62; 216/72; 438/706; 438/710; 438/712; 438/725; 438/738

(58) Field of Classification Search ................... 216/22; 438/706
See application file for complete search history.

(56) References Cited

U.S. PATENT DOCUMENTS 4,883,730 A * 11/1989 Ahne et al. .................... 430/18

(Continued)

FOREIGN PATENT DOCUMENTS

EP    0 470 707 A2    2/1992

(Continued)

OTHER PUBLICATIONS

L. Martinu, Proceedings of the 4th International Conference on Properties and applications of Dielectric Materials, (Jul. 3-8, 1994), 227-230.*

(Continued)

*Primary Examiner*—Lan Vinh
*Assistant Examiner*—Maki Angadi
(74) *Attorney, Agent, or Firm*—Oblon, Spivak, McClelland, Maier & Neustadt, P.C.

(57) ABSTRACT

A plasma processing method includes a step of preparing a process subject having an organic layer on a surface thereof, and a step of irradiating the process subject with $H_2$ plasma to improve plasma resistance of the organic layer.

66 Claims, 15 Drawing Sheets

U.S. PATENT DOCUMENTS

| | | | |
|---|---|---|---|
| 5,011,705 A * | 4/1991 | Tanaka | 427/534 |
| 5,310,453 A * | 5/1994 | Fukasawa et al. | 438/716 |
| 5,403,436 A * | 4/1995 | Fujimura et al. | 216/69 |
| 5,441,914 A | 8/1995 | Taft et al. | |
| 5,677,242 A | 10/1997 | Aisou | |
| 5,997,962 A * | 12/1999 | Ogasawara et al. | 427/535 |
| 6,465,359 B2 * | 10/2002 | Yamada et al. | 438/706 |
| 6,686,296 B1 * | 2/2004 | Costrini et al. | 438/725 |
| 2002/0058390 A1 | 5/2002 | Imai | |
| 2004/0026040 A1 * | 2/2004 | Kurihara et al. | 156/345.48 |

FOREIGN PATENT DOCUMENTS

| | | |
|---|---|---|
| EP | 0 644 582 A2 | 3/1995 |
| JP | 4-151668 | 5/1992 |
| JP | 6-232098 | 8/1994 |
| JP | 7-106310 | 4/1995 |
| JP | 8-55791 | 2/1996 |
| JP | 9-306893 | 11/1997 |
| JP | 10-261628 | 9/1998 |
| JP | 10-268526 | 10/1998 |
| JP | 2000-269198 | 9/2000 |
| JP | 2001-244245 | 9/2001 |
| JP | 2002-43590 | 2/2002 |
| WO | WO 97/17725 | 5/1997 |
| WO | 99/30357 | 6/1999 |

OTHER PUBLICATIONS

Cuan-Lun Cheng, Applied Physics Letters, vol. 70(2), (1997), pp. 223-225.*

Lee W.W. et al, "Fabrication of 0.06 μm Poly-Si Gate Using DUV Lithography with Designated Si,O,N, Film as an Arc and Hardmask" Proceedings of 1997 Symposium on VLSI Technology, Kyoto, Japan, Jun. 10-12, 1997, pp. 131-132.

Y. Ye et al. "0.35-Micron and Sub-0.35-Micron Metal Stack Etch in a DPS Chamber-DPS Chamber and Process Characterization" Proceedings of the Eleventh International Symposium on Plasma Processing, May 5-10, 1996, Electrochemical Society Proceedings Vol. 96-12, pp. 222-233.

* cited by examiner

PLASMA PROCESSING METHOD

CROSS-REFERENCES TO RELATED APPLICATIONS

This is a continuation-in-part application of application Ser. No. 10/607,537, filed Jun. 27, 2003 now abandoned.

BACKGROUND OF THE INVENTION

1. Field of the Invention

The present invention relates to a plasma processing method used in the process of manufacturing semiconductor devices.

2. Description of the Related Art

When plasma etching is performed on an etching objective layer, a resist mask formed of, e.g., a photoresist is used. Particularly, in accordance with demands for micro-patterning, a photoresist frequently used in recent years is an ArF photoresist or F2 photoresist, i.e., a photoresist to be exposed to laser light from a light source of ArF gas or $F_2$ gas, which is suitable for forming an opening pattern of about 0.13 μm or less.

However, since the ArF photoresist layer and F2 photoresist layer have a low plasma resistance, they cause a problem in that the surface of the photoresist layer becomes rough during etching. If the surface of the photoresist layer becomes rough, the shapes of opening portions are deformed with the etching progress, thereby making it difficult to obtain the designed shapes of etched holes or etched grooves. Furthermore, during etching, the photoresist disappears at some positions, and the etching proceeds to portions that are designed to be non-etched.

As a method of improving the plasma resistance of a photoresist layer, there is a method of irradiating the surface of a photoresist layer with ultraviolet rays, an electron beam, or an ion beam (Jpn. Pat. Appln. KOKAI Publication No. 60-110124, Jpn. Pat. Appln. KOKAI Publication No. 2-252233, and Jpn. Pat. Appln. KOKAI Publication No. 57-157523), a method of heat-setting a photoresist (Jpn. Pat. Appln. KOKAI Publication No. 4-23425), or a method of applying heat or light energy to an organic Si compound to coat the surface of a photoresist layer with a thin cured layer (Jpn. Pat. Appln. KOKAI Publication No. 2-40914).

In the above-described methods of improving the plasma resistance of a photoresist layer, it is necessary to perform a process of improving the plasma resistance in a container other than a container used in an etching step performed thereafter. Since a process subject to be processed needs to be transferred from the container for performing the process of improving the plasma resistance of a photoresist layer to the etching container, the yield is lowered in the transfer step and throughput is lowered due to a necessary transfer time. Furthermore, since the container for performing the process of improving the plasma resistance needs to be provided independently of the etching container, not only an additional space is required, but also the cost increases.

The etching container may be provided additionally with ultraviolet ray radiating means or heating means without independently disposing a container for performing the process of improving the plasma resistance. In this case, however, since the structure still requires the ultraviolet ray radiating means or heating means, the cost also increases.

On the other hand, where an etching objective portion is covered directly with a photoresist layer, the designed dimension accuracy of opening patterns is lowered in a step performed thereafter of performing exposure and development on the photoresist layer to form the opening patterns. For this reason, an antireflective layer is interposed between the etching objective portion and photoresist mask layer. It has been proposed to etch the antireflective layer with plasma of a gas containing a substance having C and F, such as a mixture gas of $C_4F_8$ and $O_2$, a mixture gas of HBr, $CF_4$, and He, or a mixture gas of $CH_2F_2$, $CF_4$, and He (Jpn. Pat. Appln. KOKAI Publication No. 10-26162). It is also known to etch the antireflective layer with an etching gas, such as a mixture gas of $CF_4$ and $O_2$ (Jpn. Pat. Appln. KOKAI Publication No. 7-307328).

However, where the antireflective layer is etched with plasma of a mixture gas of $C_4F_8$ and $O_2$, or a mixture gas of $CF_4$ and $O_2$, a problem arise such that the surface of the ArF photoresist layer becomes rough, a vertical stripe is formed in the ArF photoresist layer, or the ArF photoresist layer disposed as a mask layer is etched to a certain extent and thus hardly functions as a mask.

BRIEF SUMMARY OF THE INVENTION

An object of the present invention is to provide a plasma processing method, which can improve the etching resistance of an organic layer, such as an ArF photoresist layer, without incurring a decrease in yield, a decrease in throughput, or an increase in cost.

Another object is to provide a plasma processing method, which can perform plasma etching, while improving the etching resistance of the organic layer, as described above.

Still another object is to provide a plasma processing method, which can maintain a high plasma resistance of a mask layer, such as an ArF photoresist layer or F2 photoresist layer, when etching an antireflective layer or underlying etching objective layer.

Still another object is to provide a plasma processing method, which can etch an underlying antireflective layer or underlying etching objective layer at a high etching rate, while suppressing the roughness of the surface of a mask layer, such as an ArF photoresist layer or F2 photoresist layer, and maintaining an excellent etching selectivity.

According to a first aspect of the present invention, there is provided a plasma processing method comprising the steps of: preparing a process subject having an organic layer on a surface thereof; and irradiating the process subject with $H_2$ plasma to improve plasma resistance of the organic layer.

According to a second aspect of the present invention, there is provided a plasma processing method comprising the steps of: preparing a process subject having an organic layer on a surface thereof; and irradiating the process subject with plasma of a process gas containing $H_2$ and an inert gas, to improve plasma resistance of the organic layer.

According to a third aspect of the present invention, there is provided a plasma processing method comprising the steps of: preparing a process subject having an organic layer on a surface thereof; and irradiating the process subject with plasma of a process gas containing a substance having H and an inert gas, to improve plasma resistance of the organic layer.

According to a fourth aspect of the present invention, there is provided a plasma processing method comprising the steps of: preparing a process subject having a photoresist layer made of an ArF photoresist or F2 photoresist on a surface thereof; and irradiating the process subject with plasma of a process gas containing a substance having H, to improve plasma resistance of the photoresist layer.

According to a fifth aspect of the present invention, there is provided a plasma processing method comprising the steps of: placing a process subject in a process container, wherein the process subject has an etching objective portion, and an organic layer covering the etching objective portion and having an opening pattern formed therein; turning a process gas containing a substance having H into plasma in the process container, and irradiating the organic layer with the plasma; and turning an etching gas into plasma in the process container, and etching the etching objective portion through the opening pattern.

According to a sixth aspect of the present invention, there is provided a plasma processing method comprising the steps of: preparing a process subject having a photoresist layer made of an ArF photoresist or F2 photoresist on a surface thereof; and irradiating the process subject with plasma of a process gas containing a substance having N, to improve plasma resistance of the photoresist layer.

According to a seventh aspect of the present invention, there is provided a plasma processing method comprising the steps of: placing a process subject in a process container, wherein the process subject has an etching objective portion, an antireflective layer covering the etching objective portion, and a photoresist layer made of an ArF photoresist or F2 photoresist, covering the antireflective layer, and having an opening pattern formed therein; supplying a process gas into the process container; turning the process gas into plasma; and causing the plasma to act on the process subject to improve plasma resistance of the photoresist layer, and to etch the antireflective layer through the opening pattern.

According to an eighth aspect of the present invention, there is provided a plasma processing method comprising the steps of: placing a process subject in a process container, wherein the process subject has an etching objective layer, an antireflective layer covering the etching objective layer, and a mask layer covering the antireflective layer and having an opening pattern formed therein; supplying a process gas containing $H_2$ into the process container; turning the process gas into plasma; and selectively etching the antireflective layer relative to the mask layer by the plasma, through the opening pattern of the mask layer.

According to a ninth aspect of the present invention, there is provided a plasma processing method comprising: a step of placing a process subject on a worktable, wherein the process subject has an etching objective layer, and a mask layer made of an ArF photoresist or F2 photoresist, covering the etching objective layer, and having an opening pattern formed therein; an initial etching step of turning $CF_4$ and $H_2$ into plasma, and etching halfway the etching objective layer through the opening pattern of the mask layer; and a main etching step of turning an etching gas containing a fluorocarbon into plasma, and etching the etching objective layer, following the initial etching step.

According to a tenth aspect of the present invention, there is provided a plasma processing method comprising: a step of placing a process subject on a worktable, wherein the process subject has an etching objective layer, an antireflective layer covering the etching objective layer, and a mask layer made of an acrylate resin, covering the antireflective layer, and having an opening pattern formed therein; a first etching step of turning $CF_4$ into plasma, and etching the antireflective layer through the opening pattern of the mask layer; a second etching step of turning $CF_4$ and $H_2$ into plasma, and etching halfway the etching objective layer through the opening pattern of the mask layer; and a third etching step of turning an etching gas containing a fluorocarbon into plasma, and etching the etching objective layer, following the second etching step.

According to an eleventh aspect of the present invention, there is provided a plasma processing method comprising the steps of: placing a process subject on a susceptor disposed in a process container, wherein the process subject has an etching objective layer, and a mask layer covering the etching objective layer and having an opening pattern formed therein; supplying a process gas containing $H_2$ into the process container; supplying the susceptor with a high-frequency power having a frequency of 100 MHz or more, and a high-frequency power having a frequency of 3 MHz or more; and setting a pressure in the process container at 13.3 Pa (100 mTorr) or less.

According to a twelfth aspect of the present invention, there is provided a plasma processing method comprising the steps of: placing a process subject in a process container, wherein the process subject has an etching objective portion, and a photoresist layer made of an ArF photoresist or F2 photoresist, covering the etching objective portion, and having an opening pattern formed therein; turning a process gas containing a substance having N into plasma in the process container, and irradiating the photoresist layer with the plasma; and turning an etching gas into plasma in the process container, and etching the etching objective portion through the opening pattern.

According to a thirteenth aspect of the present invention, there is provided a plasma processing method comprising: a step of placing a process subject in a process container, wherein the process subject has an etching objective portion, an antireflective layer covering the etching objective portion, and a photoresist layer made of an ArF photoresist or F2 photoresist, covering the antireflective layer, and having an opening pattern formed therein; a first etching step of turning a process gas containing a substance having N into plasma in the process container, and etching the antireflective layer through the opening pattern; and a second etching step of turning an etching gas into plasma in the process container, and etching the etching objective portion through the opening pattern.

According to a fourteenth aspect of the present invention, there is provided a plasma processing method comprising the steps of: placing a process subject in a process container, wherein the process subject has an etching objective layer, and an organic mask layer covering the etching objective layer and having an opening pattern formed therein, and the process container includes a component with an exposed portion made of a substance having Si; supplying a process gas of one or more selected from the group consisting of $H_2$, $N_2$, and He into the process container; and turning the process gas into plasma, and plasma-processing the organic mask layer.

According to a fifteenth aspect of the present invention, there is provided a plasma processing method comprising the steps of: placing a process subject in a process container, wherein the process subject has an etching objective layer, an organic film covering the etching objective layer, and an organic mask layer covering the organic film and having an opening pattern formed therein, and the process container includes a component with an exposed portion made of a substance having Si; supplying an etching gas into the process container; turning the etching gas into plasma, and etching the organic film through the opening pattern of the organic mask layer; supplying a process gas of one or more selected from the group consisting of $H_2$, $N_2$, and He into the process container; and turning the process gas into plasma, and plasma-processing the organic mask layer.

According to a sixteenth aspect of the present invention, there is provided a plasma processing method comprising the steps of: placing a process subject in a process container, wherein the process subject has an etching objective layer, an organic film covering the etching objective layer, and an organic mask layer covering the organic film and having an opening pattern formed therein, and the process container includes a component with an exposed portion made of a substance having Si; supplying $H_2$ into the process container; and turning the supplied $H_2$ into plasma, and etching the organic film through the opening pattern of the organic mask layer.

According to a seventeenth aspect of the present invention, there is provided a plasma processing method comprising the steps of: placing a process subject in a process container, wherein the process subject has an etching objective layer, and a photoresist layer made of an ArF photoresist or F2 photoresist, covering the etching objective layer, and having an opening pattern formed therein; supplying a process gas containing $C_2F_4$ into the process container accommodating the process subject; turning the process gas into plasma; and etching the etching objective layer on the process subject by the plasma of the process gas through the opening pattern of the photoresist layer.

According to an eighteenth aspect of the present invention, there is provided a plasma processing method comprising the steps of: placing a process subject in a process container, wherein the process subject has an etching objective layer, and a mask layer covering the etching objective layer and having an opening pattern formed therein; supplying a process gas containing $C_2F_4$ and $O_2$ into the process container accommodating the process subject; turning the process gas into plasma; and etching the etching objective layer on the process subject by the plasma of the process gas through the opening pattern of the mask layer.

According to a nineteenth aspect of the present invention, there is provided a plasma processing method comprising the steps of: placing a process subject in a process container, wherein the process subject has an etching objective portion, an antireflective layer covering the etching objective portion, and a photoresist layer made of an ArF photoresist or F2 photoresist, covering the antireflective layer, and having an opening pattern formed therein; turning an etching gas containing a substance having C and F and a substance having H into plasma in the process container, and etching the antireflective layer through the opening pattern; and etching the etching objective portion.

According to a twentieth aspect of the present invention, there is provided a plasma processing method comprising the steps of: placing a process subject in a process container, wherein the process subject has an etching objective portion, an antireflective layer covering the etching objective portion, and a mask layer covering the antireflective layer and having an opening pattern formed therein; turning an etching gas containing a substance having C and F, and a hydrocarbon into plasma in the process container, and etching the antireflective layer through the opening pattern; and etching the etching objective portion.

According to a twenty-first aspect of the present invention, there is provided a plasma processing method comprising the steps of: placing a process subject in a process container, wherein the process subject has an etching objective portion, an antireflective layer covering the etching objective portion, and a mask layer covering the antireflective layer and having an opening pattern formed therein; turning an etching gas into plasma in the process container, and etching the antireflective layer through the opening pattern, wherein the etching gas contains a substance having C and F, and a substance having C, H, and F in which the number of H atoms relative to the number of F atoms is three or more; and etching the etching objective portion.

According to a twenty-second aspect of the present invention, there is provided a plasma processing method comprising the steps of: placing a process subject in a process container, wherein the process subject has an etching objective portion, and a photoresist layer made of an ArF photoresist or F2 photoresist, covering the etching objective portion, and having an opening pattern formed therein; turning a process gas containing a substance having C and F, and CO into plasma in the process container, and irradiating the photoresist layer with the plasma; and turning an etching gas into plasma in the process container, and etching the etching objective portion by the plasma of the etching gas through the opening pattern.

According to a twenty-third aspect of the present invention, there is provided a plasma processing method comprising: a step of placing a process subject in a process container, wherein the process subject has an etching objective portion, an antireflective layer covering the etching objective portion, and a photoresist layer made of an ArF photoresist or F2 photoresist, covering the antireflective layer, and having an opening pattern formed therein; a first etching step of turning a first etching gas containing a substance having C and F, and CO into plasma in the process container, and etching the antireflective layer by the plasma through the opening pattern; and a second etching step of turning a second etching gas into plasma in the process container, and etching the etching objective portion by the plasma of the second etching gas through the opening pattern.

According to a twenty-fourth aspect of the present invention, there is provided a plasma processing method comprising: a step of placing a process subject in a process container, wherein the process subject has an etching objective portion, an antireflective layer covering the etching objective portion, and a mask layer covering the antireflective layer and having an opening pattern formed therein; a first etching step of turning a first etching gas containing $CF_4$ and CO into plasma in the process container, and etching the antireflective layer by the plasma through the opening pattern; and a second etching step of turning a second etching gas into plasma in the process container, and etching the etching objective portion by the plasma of the second etching gas through the opening pattern.

According to a twenty-fifth aspect of the present invention, there is provided a plasma processing method comprising the steps of: placing a process subject in a process container, wherein the process subject has an etching objective layer, an organic antireflective layer covering the etching objective layer, and a photoresist layer made of an ArF photoresist or F2 photoresist, covering the organic antireflective layer, and having an opening pattern formed therein; supplying an etching gas containing a substance having Si into the process container; and turning the etching gas into plasma, and etching the organic antireflective layer through the opening pattern of the photoresist layer.

According to a twenty-sixth aspect of the present invention, there is provided a plasma processing method comprising the steps of: placing a process subject on a susceptor disposed in a process container, wherein the process subject has an etching objective layer, and a mask layer covering the etching objective layer and having an opening pattern formed therein; supplying an inert gas into the process container in a state where the process subject and a member having a surface at least a part of which is made of Si are present in the process container; supplying the process container with high-frequency energy to ionize at least a part of the inert gas; supplying an etching gas into the process container; turning the etching gas into plasma; and etching the etching objective layer by the plasma of the etching gas through the opening pattern of the mask layer in the process container.

According to a twenty-seventh aspect of the present invention, there is provided a plasma processing method comprising the steps of: placing a process subject on a susceptor disposed in a process container, wherein the process subject has an etching objective layer, and a mask layer covering the etching objective layer and having an opening pattern formed therein; forming a Si-containing layer on a surface of the mask layer in the process container; supplying an etching gas into the process container; turning the etching gas into plasma; and etching the etching objective layer by the plasma of the etching gas through the opening pattern of the mask layer in the process container.

According to a twenty-eighth aspect of the present invention, there is provided a plasma processing method comprising the steps of: preparing a process container such that a member having a surface at least a part of which is made of Si, a first electrode, and a second electrode facing the first electrode are disposed in the process container; placing a process subject on the first electrode disposed in the process container, wherein the process subject has an etching objective layer, and a mask layer covering the etching objective layer and having an opening pattern formed therein; supplying an inert gas into the process container; applying a high-frequency power to the first electrode; applying a high-frequency power to the second electrode; supplying an etching gas into the process container; and etching the etching objective layer by the etching gas turned into plasma by the high-frequency powers through the opening pattern of the mask layer in the process container.

According to a twenty-ninth aspect of the present invention, there is provided a plasma processing method comprising the steps of: placing a process subject on a susceptor disposed in a process container, wherein the process subject has an etching objective layer, and a photoresist layer made of an ArF photoresist or F2 photoresist, covering the etching objective layer, and having an opening pattern formed therein; supplying an etching gas containing an Si compound into the process container; turning the etching gas into plasma; and etching the etching objective layer by the plasma of the etching gas through the opening pattern of the photoresist layer in the process container.

DETAILED DESCRIPTION OF THE INVENTION

Embodiments of the present invention will be described with reference to the accompanying drawings.

Figure 1:
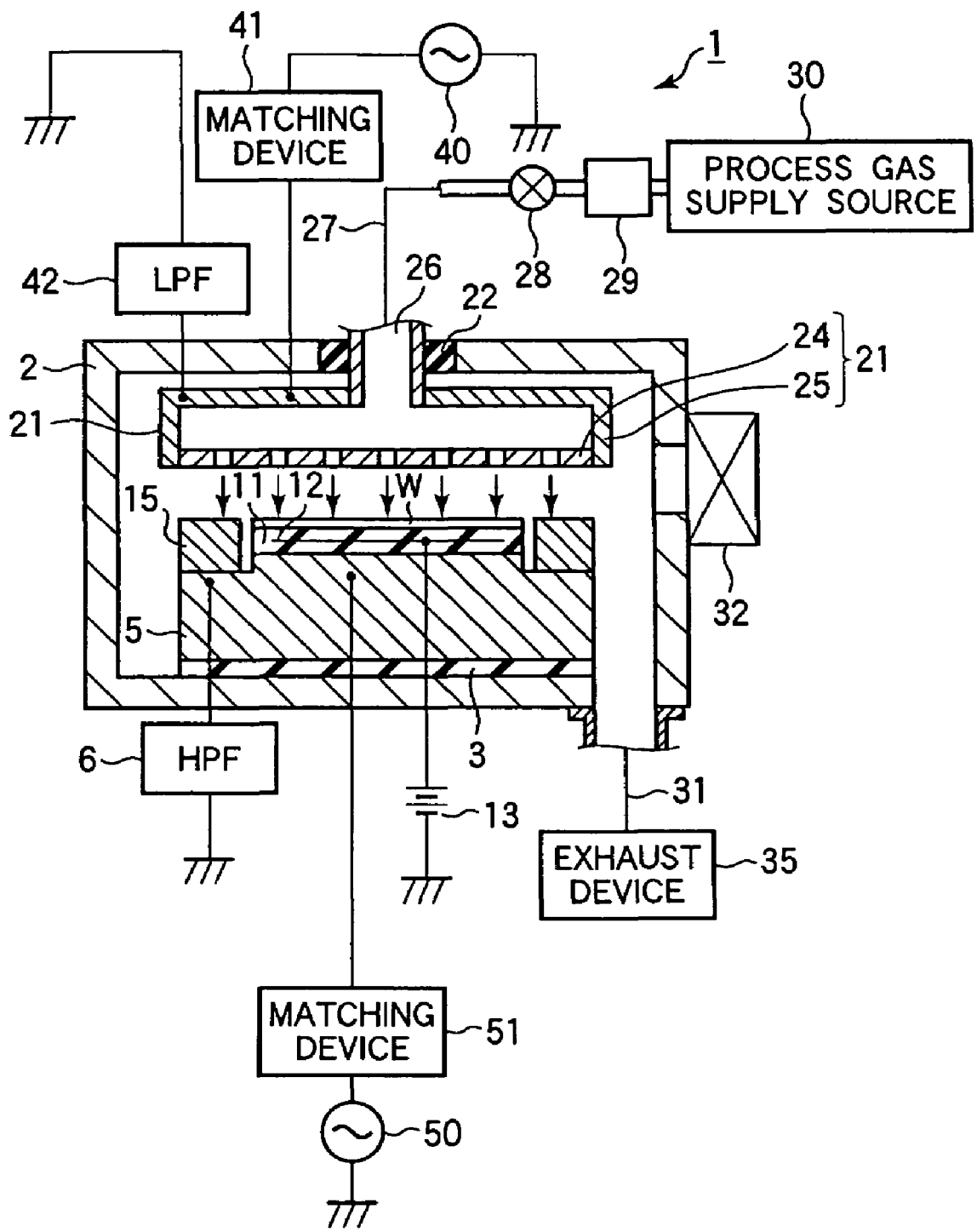
FIG. 1 is a sectional view showing an example of a plasma processing apparatus, which can perform a plasma processing method according the present invention.

FIG. 1 is a sectional view showing an example of a plasma processing apparatus, which can perform a plasma processing method according the present invention.

This plasma processing apparatus 1 has a process container 2. The process container 2 is made of a metal, such as aluminum with an anodized surface, and is grounded for safety. The process container 2 is provided with a susceptor 5 disposed therein on the bottom through an insulator 3. The susceptor 5 functions as the lower electrode of parallel-plate electrodes. The susceptor 5 is connected to a high-pass filter (HPF) 6, and also to a second high-frequency power supply 50 through a matching device 51. An electrostatic chuck 11 is provided on the susceptor 5 to place a process subject W, such as a semiconductor wafer, thereon.

The electrostatic chuck 11 is arranged such that an electrode 12 is sandwiched between insulators. The electrode 12 is supplied with a DC voltage from a DC power supply 13 connected thereto, so that the process subject W is attracted and held by means of electrostatic force. A focus ring 15 made of alumina, Si, $SiO_2$, or the like is disposed around the process subject W to improve etching uniformity.

An upper electrode plate 24, which is made of Si, $SiO_2$, amorphous carbon, or the like, and has a structure as a showerhead, is supported by a support body 25 above the susceptor 5 to face the susceptor 5. The upper electrode plate 24 and support body 25 constitute the upper electrode 21 of the parallel-plate electrodes to face the susceptor 5. The upper electrode 21 is connected to a low-pass filter 42, and also to a first high-frequency power supply 40 through a matching device 41.

A gas inlet port 26 is formed at the center of the top of the upper electrode 21. The gas inlet port 26 is connected to a gas supply line 27, on which a valve 28, mass-flow controller 29, and process gas supply source 30 are provided in this order from the gas inlet port 26. The process gas supply source 30 supplies predetermined process gases.

On the other hand, the bottom of the process container 2 is connected to an exhaust line 31, on which an exhaust device 35 is provided. The process container 2 is provided with a gate valve 32 on the sidewall, so that a process subject W can be transferred between the process container 2 and an adjacent load-lock chamber (not shown).

According to the apparatus having the structure described above, the gate valve 32 is first opened, and a process subject W is transferred into the process container 2 and placed on the electrostatic chuck 11. Then, the gate valve 32 is closed, and the pressure in the process container 2 is reduced by the exhaust device 35. Then, the valve 28 is opened, and a predetermined process gas is supplied from the etching gas supply source 30, thereby setting the pressure in the process container 2 at a predetermined value.

In this state, high-frequency powers are applied from the first and second high-frequency power supplies 40 and 50 to turn the process gas into plasma. Consequently, a plasma process (plasma resistance improvement or plasma etching) is performed on a predetermined film of the process subject W. Before or after the timing when the high-frequency powers are applied from the first and second high-frequency power supplies 40 and 50, a DC voltage is applied to the electrode 12 in the electrostatic chuck 11 to electrostatically attract and hold the process subject W on the electrostatic chuck 11. In this state, a predetermined plasma process is performed.

Figure 2:
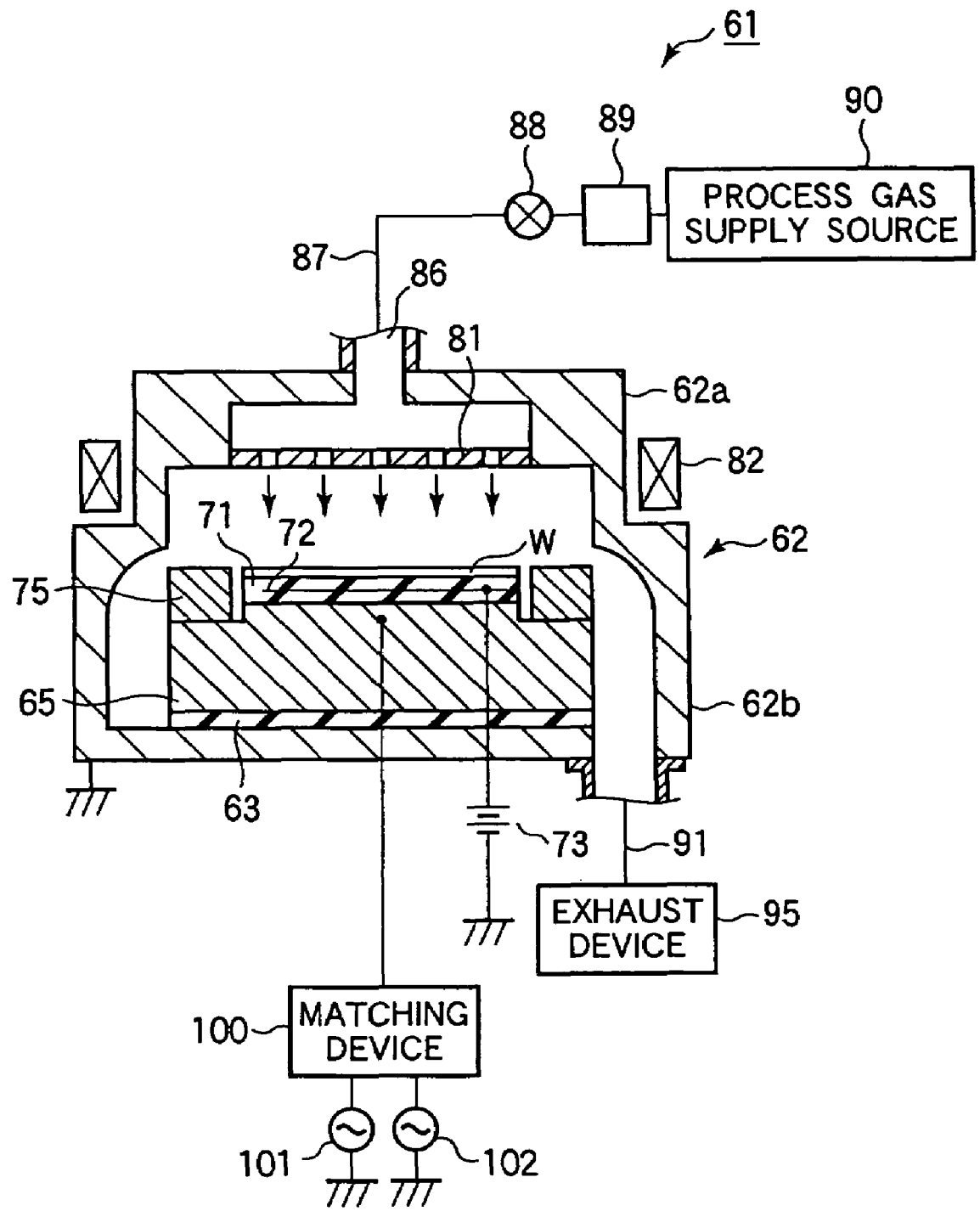
FIG. 2 is a sectional view showing another example of a plasma processing apparatus, which can perform a plasma processing method according the present invention.

FIG. 2 is a sectional view showing another example of a plasma processing apparatus, which can perform the present invention.

This plasma etching apparatus 61 has a process container 62. The process container 62 is formed of a stepped cylinder having an upper portion 62a with a smaller diameter and a lower portion 62b with a larger diameter. The process container 62 is made of a metal, such as aluminum with an anodized surface, and is grounded. The process container 62 is provided with a susceptor 65 disposed therein on the bottom through an insulator 63. The susceptor 65 is made of a conductive material, such as aluminum with an anodized surface, and functions as the lower electrode of parallel-plate electrodes. An electrostatic chuck 71 is provided on the susceptor 65 to place a process subject W, such as a semiconductor wafer, thereon.

The electrostatic chuck 71 is arranged such that an electrode 72 is sandwiched between insulators. The electrode 72 is supplied with a DC voltage from a DC power supply 73 connected thereto, so that the process subject W is attracted and held by means of electrostatic force. A focus ring 75 made of Si, $SiO_2$, or the like is disposed around the process subject W to improve etching uniformity.

An upper electrode plate 81, which is made of Si or the like, and has a structure as a showerhead, is supported by an upper portion 62a of the process container 62 above the susceptor 65 to face the susceptor 65. The process container 62 also functions as an electrode of the parallel-plate electrodes to face the susceptor. A multi-pole ring magnet 82 is rotatably disposed around the upper portion 62a of the process container 62.

A gas inlet port 86 is formed at the center of the top of the process container 62. The gas inlet port 86 is connected to a gas supply line 87, on which a valve 88, mass-flow controller 89, and process gas supply source 90 are provided in this order from the gas inlet port 86. The process gas supply source 90 supplies predetermined process gases.

On the other hand, the bottom of the process container 62 is connected to an exhaust line 91, on which an exhaust device 95 is provided. The process container 62 is provided with a gate valve (not shown) on the sidewall, so that a process subject W can be transferred between the process container 62 and an adjacent load-lock chamber (not shown).

The susceptor 65 functioning as the lower electrode is connected to a first high-frequency power supply 101 and a second high-frequency power supply 102 through a matching device 100. The first and second high-frequency power supplies 101 and 102 have frequencies of, e.g., 100 MHz and 3.2 MHz, respectively.

According to the apparatus having the structure described above, the gate valve (not shown) is first opened, and a process subject W is transferred into the process container 62 and placed on the electrostatic chuck 71. Then, the gate valve is closed, and the pressure in the process container 62 is reduced by the exhaust device 95. Then, the valve 88 is opened, and a predetermined process gas is supplied from the etching gas supply source 90, thereby setting the pressure in the process container 62 at a predetermined value.

In this state, high-frequency powers are applied from the first and second high-frequency power supplies 101 and 102 to turn the process gas into plasma. Consequently, a plasma process (plasma resistance improvement or plasma etching) is performed on a predetermined film of the process subject W. Before or after the timing when the high-frequency powers are applied from the first and second high-frequency power supplies 101 and 102, a DC voltage is applied to the electrode 72 in the electrostatic chuck 71 to electrostatically attract and hold the process subject W on the electrostatic chuck 71. In this state, a predetermined plasma process is performed.

Next explanations will be given of plasma processing methods according to embodiments of the present invention.

First Embodiment

Figure 3:
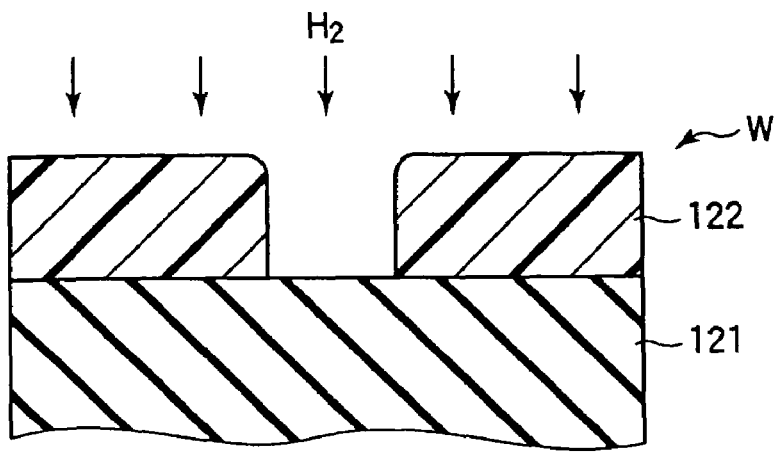
FIG. 3 is a sectional view schematically showing a process subject used in a first embodiment of the present invention.

In this embodiment, the plasma processing apparatus 1 shown in FIG. 1 is used to process a process subject W shown in FIG. 3. This process subject W has an $SiO_2$ film 121 disposed as an etching objective layer, and a photoresist layer 122 of an ArF photoresist or F2 photoresist disposed as a mask layer covering the etching objective layer. This process includes a step of irradiating the process subject W with plasma to improve the plasma resistance of the photoresist layer 122, and a step performed thereafter of plasma-etching the etching objective layer 121 while using the photoresist layer 122 as a mask.

The ArF photoresist or F2 photoresist may be made of an alicyclic group-containing acrylate resin, cycloolefin resin, cycloolefin-maleic anhydride resin, methacrylate resin, or the like.

The gate valve 32 is first opened, and the process subject W is transferred into the process container 2 and placed on the electrostatic chuck 11. Then, the gate valve 32 is closed, and the pressure in the process container 2 is reduced by the exhaust device 35. Then, the valve 28 is opened, and a process gas, such as $H_2$, is supplied from the process gas supply source 30, thereby setting the pressure in the process container 2 at a predetermined value, preferably of not more than 13.3 Pa (100 mTorr), such as 6.7 Pa (50 mTorr). In this state, high-frequency powers are applied to the upper electrode 21 and the lower electrode or susceptor 5 to turn the process gas into plasma, thereby irradiating the photoresist layer 122 on the process subject W with the plasma. Before or after the timing when the high-frequency powers are applied to the upper and lower electrodes, a DC voltage is applied to the electrode 12 in the electrostatic chuck 11 from the DC power supply 13 to electrostatically attract and hold the process subject W on the electrostatic chuck 11.

In place of $H_2$ plasma, it is possible for the irradiation to use plasma of a process gas containing $H_2$ and an inert gas, such as He, Ne, Ar, Kr, or Xe, plasma of another substance having H, or plasma of a substance having H and another substance, such as inert gas. An example of another substance having H is $NH_3$. By the irradiation with such a gas, the plasma resistance of the photoresist layer 122, which is an organic layer, is improved. Although it is not clear in detail, this mechanism seems to be as follows. Specifically, the plasma containing H accelerates cross-linking reaction of the photoresist layer or organic layer, and C—O bonds or C—H bonds turn into C—C bonds to enhance chemical bonds, thereby improving the plasma resistance. $H_2$ or $NH_3$ is preferably used as a substance having H, as described above, because it can be easily handled. In place of $NH_3$, which is a substance also having N, another substance having N, such as $N_2$, may be contained in the process gas. $N_2$ is advantageous, because it can also be easily handled. Where a substance having N is used as the process gas, the plasma resistance of the photoresist layer 122 is also improved. Accordingly, a substance having N may be used, while using no substance having H. In this case, although it is not clear in detail, the mechanism for improving the plasma resistance seems to be as follows. Specifically, N combines with C in the ArF photoresist to form a protection film of the CN family on the surface of the ArF photoresist, thereby improving the plasma resistance of the ArF photoresist. Where the process gas contains a substance having N, such as $N_2$, it preferably further contains a substance having H. This is so, because the presence of H accelerates bonding of N and C. As a substance having H, it is possible to use one or more substances selected from the group consisting of $H_2$, $CHF_3$, $CH_2F_2$, and $CH_3F$.

After the plasma irradiation is performed for a predetermined time, as described above, the process gas and high-frequency powers stop being supplied.

Then, the pressure in the process container 2 is set at a predetermined value, such as 2.0 Pa (15 mTorr), which is stable for an etching step, and an etching gas is supplied from the process gas supply source 30. As the etching gas, a gas containing a fluorocarbon, such as $C_5F_8$, is preferably used. An actual example may be $C_5F_8+O_2+Ar$. Where the etching objective portion is an $SiO_2$ layer, and the etching gas is a gas containing $C_5F_8$, the selectivity of the $SiO_2$ film 121, i.e., the etching objective portion, relative to the photoresist layer 122, i.e., an organic layer, (the etching rate of the etching objective portion/the etching rate of the organic layer) is high. Of $C_5F_8$, a straight-chain $C_5F_8$ is preferable due to high selectivity, and particularly where 1,1,1,4,4,5,5,5-octafluoro-2-pentyne (which will be referred to as "2-$C_5F_8$") thereof is used, the selectivity becomes very high. As the etching gas, a gas containing $C_4F_6$ is also preferable. Where $C_4F_6$ is used, a polymer is deposited on the ArF photoresist in the etching step, and thus the photoresist is hardly reduced, so that an etched hole is formed while maintaining a desired opening shape.

As described above, the upper electrode 21 and the lower electrode or susceptor 5 are supplied with high-frequency powers while the etching gas is supplied. Consequently, the etching gas is turned into plasma to etch the $SiO_2$ film 121 with plasma, using the photoresist layer 122 as a mask.

During the etching, an end-point detector (not shown) is used to detect a predetermined light intensity, so that the etching is finished based thereon.

The etching objective portion is not limited to the $SiO_2$ film. This may be applied to etching of oxide film (oxygen compound) such as TEOS, BPSG, PSG, SOG, thermal oxidation film, HTO, FSG, organic Si oxide film, CORAL (Novellus Systems), low dielectric constant organic insulating film, or the like. In this case, the etching gas may be a gas formed of the process gas and another gas added thereto, depending on the material of the etching objective portion. Where the etching can be performed only by adding another gas after the step of irradiation with process gas plasma, it is possible to continuously perform the step of irradiation with process gas plasma and the step of etching, while maintaining plasma discharge. An actual example may be as follows. Specifically, $H_2$ is used as a process gas in the step of irradiation with process gas plasma, and then a mixture gas of $H_2$, $CF_4$, and Ar is used as an etching gas to perform the step of etching an etching objective portion, such as an organic oxide film.

Another organic photoresist layer, or another organic layer other than photoresist may be used, in place of a photoresist material having a low plasma resistance, such as an ArF photoresist or F2 photoresist. Also, the structure of the plasma processing apparatus is not limited to that shown in FIG. 1.

Next, an explanation will be given of a present example of a method according to the first embodiment.

In this present example, the step of irradiation with plasma was performed under the following conditions. Specifically, the pressure in the process container was set at 6.7 Pa (50 mTorr); the flow rate of the process gas $H_2$ at 0.05 to 0.2 L/min (50 to 200 sccm); the irradiation time at 30 seconds; a high-frequency power having a frequency of 60 MHz applied to the upper electrode at a power of 500 to 1,000 W; and no high-frequency power applied to the lower electrode. The etching step was performed under the following conditions. Specifically, the pressure in the process container was set at 2.0 Pa (15 mTorr); the flow rate of the etching gas $C_5F_8$, Ar, and $O_2$ respectively at 0.015 L/min (15 sccm), 0.38 L/min (380 sccm), and 0.019 L/min (19 sccm); a high-frequency power having a frequency of 60 MHz applied to the upper electrode at a power of 2,170 W; and a high-frequency power having a frequency of 2 MHz applied to the lower electrode at a power of 1,550 W.

This present example was compared with a comparative example having no step of irradiation with plasma, in terms of the selectivity of the $SiO_2$ film relative to the ArF photoresist mask in the etching step (the etching rate of the $SiO_2$ film/the etching rate of the ArF photoresist mask). At all the four measurement points on the process subject W, the present example with plasma irradiation was higher in the selectivity, as compared to the comparative example without plasma irradiation. The increase rate was 6 to 19%.

Second Embodiment

Figure 4A:
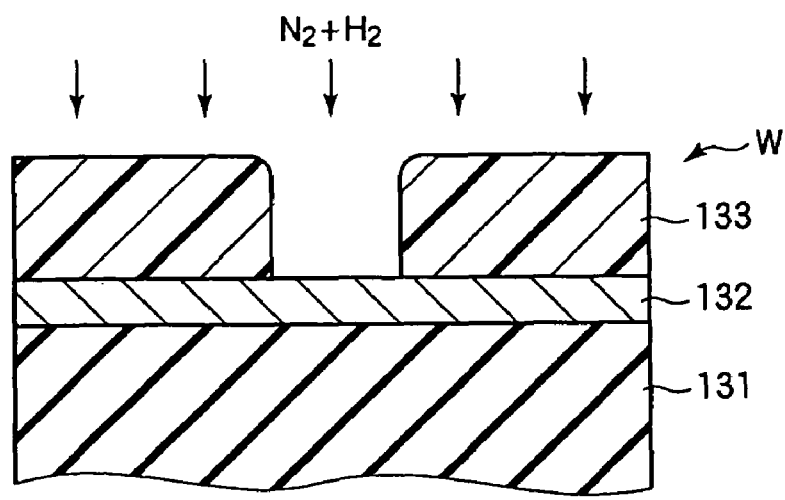
FIGS. 4A and 4B are sectional views schematically showing states of a process subject used in a second embodiment of the present invention, in order of step.
Figure 4B:
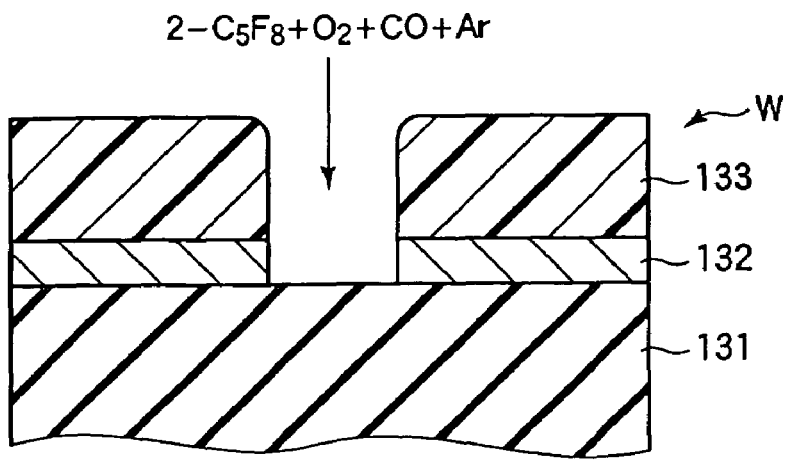

In this embodiment, the plasma processing apparatus 1 shown in FIG. 1 is used to process a process subject W shown in FIG. 4A. This process subject W has an $SiO_2$ film 131, an antireflective film 132 covering the $SiO_2$ film 131, and a photoresist layer 133 of an ArF photoresist or F2 photoresist covering the antireflective film 132. This process includes a first etching step (FIG. 4A) of etching the antireflective film 132 through a pattern opening of the photoresist layer 133 and improving the plasma resistance of the photoresist layer 133, and a second etching step (FIG. 4B) performed thereafter of plasma-etching the $SiO_2$ film 131 through the photoresist layer 133.

A process subject W is first transferred into and placed in the process container 2. A process gas used also as a first etching gas, such as $N_2$ and $H_2$, is supplied from the process gas supply source 30, and the pressure in the process container 2 is set at a predetermined value, such as 107 Pa (800 mTorr). At this time, the pressure in the process container is set preferably at 107 to 160 Pa (800 to 1,200 mTorr), because of the following reason. If it is less that 107 Pa, the photoresist layer 133, particularly at the shoulder portion of a pattern opening, is etched. If it is more than 160 Pa, the etching cannot proceed at an opening portion. As the process gas used also as a first etching gas, a gas containing N, such as $N_2$ or $NH_3$, may be used, or a gas containing H, such as one or more selected from the group consisting of $H_2$, $CHF_3$, $CH_2F_2$, and $CH_3F$, may be used.

Then, the upper and lower electrodes are supplied with high-frequency powers to turn the first etching gas into plasma, thereby etching the antireflective film 132, using the photoresist layer 133 as a mask. As the antireflective film, amorphous carbon or organic polymeric material may be used. This etching is used also as a process of improving the plasma resistance of the photoresist layer 133 at the same time. After the etching is performed for a predetermined time, the first etching is finished.

As described above, since the process gas and the etching gas are the same, no gas switching is necessary between the step of irradiating the photoresist layer 133 with plasma and the step of etching the antireflective layer 132, thereby shortening the processing time, and improving the throughput. During the etching of the antireflective layer 132, the ArF photoresist is subjected to a plasma resistance improvement process, whereby no additional apparatus or space for this is necessary.

Then, the process gas (first etching gas) is switched to an etching gas (second etching gas) to perform a second etching of plasma-etching the $SiO_2$ film 131 through the photoresist 133, as in the first etching. As the etching gas at this time, a gas containing a fluorocarbon, such as $C_5F_8$, is preferably used, as in the first embodiment. An actual example may be $C_5F_8$+$O_2$+CO+Ar. Of $C_5F_8$, a straight-chain $C_5F_8$ is preferable, and particularly 2-$C_5F_8$ is more preferable. As a fluorocarbon in the etching gas, $C_4F_6$ is also preferable.

Also in the second embodiment, the etching objective portion is not limited to the $SiO_2$ film. This may be applied to etching of oxide film (oxygen compound) such as TEOS, BPSG, PSG, SOG, thermal oxidation film, HTO, FSG, organic Si oxide film, CORAL (Novellus Systems), low dielectric constant organic insulating film, or the like. Another organic photoresist layer, or another organic layer other than photoresist may be used, in place of a photoresist material having a low plasma resistance, such as an ArF photoresist or F2 photoresist. Also, the structure of the plasma processing apparatus is not limited to that shown in FIG. 1.

Next, an explanation will be given of present examples of a method according to the second embodiment.

In the present examples, the first etching was performed under the following conditions. Specifically, the pressure in the process container was set at 107 Pa (800 mTorr); the flow rate of the process gas (first etching gas) $N_2$ and $H_2$ respectively at 0.6 L/min (600 sccm) and 0.6 L/min (600 sccm); a high-frequency power having a frequency of 60 MHz applied to the upper electrode at a power of 1,000 W; and a high-frequency power having a frequency of 2 MHz applied to the lower electrode at a power of 300 W. The second etching was performed under the following conditions. Specifically, of the second etching, in a case (Present example 2-1) where the etching gas was a gas containing 1,2,3,3,4,4,5,5-octafluoro-cyclo-1-penten (which will be referred to as "c-$C_5F_8$"), the pressure in the process container was set at 2.0 Pa (15 mTorr); the flow rate of the etching gas c-$C_5F_8$, Ar, and $O_2$ respectively at 0.015 L/min (15 sccm), 0.38 L/min (380 sccm), and 0.019 L/min (19 sccm); a high-frequency power having a frequency of 60 MHz applied to the upper electrode at a power of 2,170 W; and a high-frequency power having a frequency of 2 MHz applied to the lower electrode at a power of 1,550 W. Of the second etching, in a case (Present example 2-2) where the etching gas was a gas containing 2-$C_5F_8$, the pressure in the process container was set at 2.7 Pa (20 mTorr); the flow rate of the etching gas 2-$C_5F_8$, Ar, $O_2$, and CO respectively at 0.027 L/min (27 sccm), 0.5 L/min (500 sccm), 0.027 L/min (27 sccm), and 0.05 L/min (50 sccm); a high-frequency power having a frequency of 60 MHz applied to the upper electrode at a power of 1,600 W; and a high-frequency power having a frequency of 2 MHz applied to the lower electrode at a power of 2,000 W.

On the other hand, as comparative examples 2-1 and 2-2, the first etching was performed with a process gas of $CF_4$ likely having no improving effect on the plasma resistance of the ArF photoresist. In the comparative example 2-1, the second etching was then performed with a gas containing c-$C_5F_8$, as in the present example 2-1. In the comparative example 2-2, the second etching was then performed with a gas containing 2-$C_5F_8$, as in the present example 2-2. Table 1 shows the result.

TABLE 1

|  | Process Gas | Etching Gas | $SiO_2$ etching rate/ ArF photoresist etching rate, in second etching step |
|---|---|---|---|
| Present Example 2-1 | $N_2 + H_2$ | c-$C_5F_8$-containing gas | 8.3 |
| Comparative Example 2-1 | $CF_4$ | c-$C_5F_8$-containing gas | 6.3 |
| Present Example 2-2 | $N_2 + H_2$ | 2-$C_5F_8$-containing gas | 63.3 |
| Comparative Example 2-2 | $CF_4$ | 2-$C_5F_8$-containing gas | 22.5 |

As shown in Table 1, the following matters were confirmed. Specifically, in the first etching step of etching the antireflective film, plasma of a mixture gas $N_2$ and $H_2$ was used, whereby the plasma resistance of the ArF photoresist film was improved. Consequently, in the second etching step performed thereafter of etching the $SiO_2$ film, the selectivity of the $SiO_2$ film relative to the ArF photoresist film ($SiO_2$ etching rate/ArF photoresist etching rate) became high.

Third Embodiment

Figure 5A:
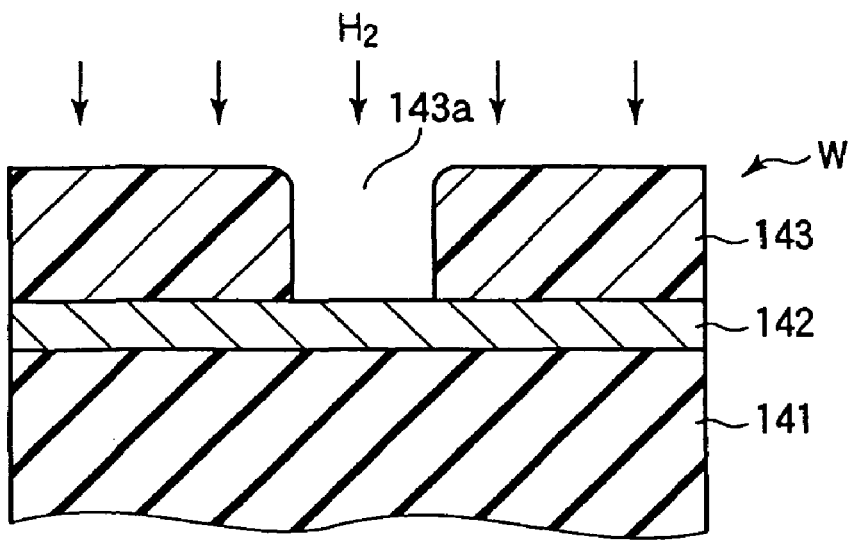
FIGS. 5A and 5B are sectional views schematically showing states of a process subject used in a third embodiment of the present invention, in order of step.
Figure 5B:
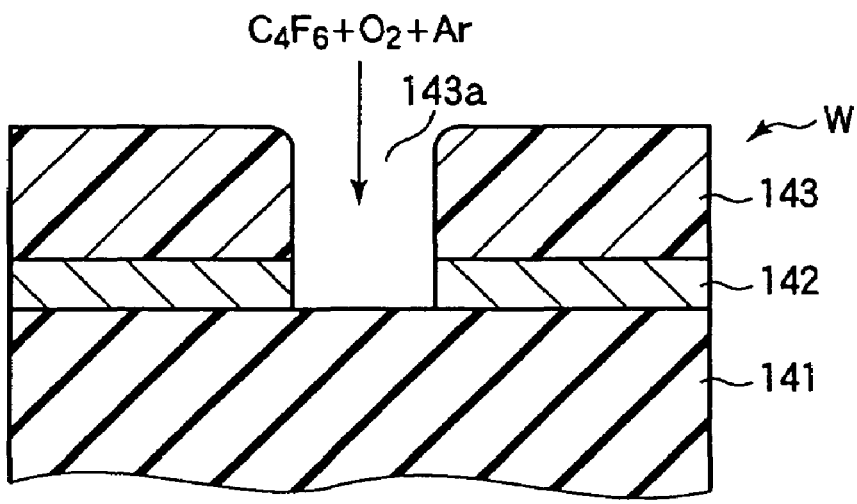

In this embodiment, the plasma processing apparatus 61 shown in FIG. 2 is used to process a process subject W shown in FIG. 5A. This process subject W has an $SiO_2$ film 141 disposed as an etching objective layer, an antireflective film 142 covering the $SiO_2$ film 141, and a photoresist layer 143 of an ArF photoresist or F2 photoresist covering the antireflective film 142. This process includes a step (FIG. 5A) of using plasma to improve the plasma resistance of the photoresist layer 143 and etch the antireflective film 142 through an opening pattern 143a of the photoresist layer 143, and a step (FIG. 5B) performed thereafter of plasma-etching the SiO$_2$ film 141 through the photoresist layer 143.

Also in this embodiment, the ArF photoresist or F2 photoresist may be made of an alicyclic group-containing acrylate resin, cycloolefin resin, or cycloolefin-maleic anhydride resin. As the antireflective layer, an organic polymeric material or amorphous carbon may be used.

The gate valve not shown is first opened, and the process subject W is transferred into the process container 62 and placed on the electrostatic chuck 71. Then, the gate valve is closed, and the pressure in the process container 62 is reduced by the exhaust device 95. Then, the valve 88 is opened, and a process gas, such as H$_2$, is supplied from the process gas supply source 90, thereby setting the pressure in the process container 62 at a predetermined value. The process gas may consist only of H$_2$, or may further contain a dilution gas, such as Ar, at a flow rate almost the same as that of H$_2$. As the process gas, another substance having H may be used in place of H$_2$.

In this state, high-frequency powers are applied from the first and second high-frequency power supplies 101 and 102 to turn the process gas into plasma to act on the process subject W. Before or after the timing when the high-frequency powers are applied, a DC voltage is applied to the electrode 72 in the electrostatic chuck 71 from the DC power supply 73 to electrostatically attract and hold the process subject W on the electrostatic chuck 71.

As described above, the plasma process is performed for a predetermined time to improve the plasma resistance of the photoresist layer 143 and etch the antireflective film 142. At this time, the pressure in the process container 62 is set preferably at 13.3 Pa (100 mTorr) or less. When the photoresist layer 143 disposed as a mask layer is irradiated with plasma of a process gas containing H under such a low pressure, the surface is reformed, thereby improving the plasma resistance of the mask layer. Since the plasma resistance of the photoresist layer 143 is improved, the selectivity of the etching objective layer relative to the mask layer, i.e., the etching rate of the etching objective layer/the etching rate of the mask layer, becomes high, in a step performed thereafter of plasma-etching the etching objective layer through the opening pattern 143a of the photoresist layer 143. Furthermore, in this etching step, the photoresist layer 143 disposed as a mask layer is prevented from suffering stripe or groove formation thereon due to plasma. Furthermore, it is possible to prevent an opening portion from being expanded in the photoresist layer 143 disposed as a mask layer. Although it is not clear in detail, the mechanism for improving the plasma resistance of the photoresist layer 143 disposed as a mask layer seems to be as follows. Specifically, H radicals act on the surface layer of the photoresist layer 143 to remove a gas of CH$_4$ or the like from the photoresist layer 143, thereby modifying the chemical bonds between carbons in the mask layer to be stronger. The process gas preferably contains no substance having N because of the following reason. If the process gas contains a substance having N, the sidewall surface of the mask layer is covered with a protection film containing C and N as the main component. The protection film prevents H radicals, which are likely to act for the plasma resistance improvement, from penetrating into the inside from the sidewall surface. As a consequence, it is difficult to improve the plasma resistance of the sidewall surface of the mask layer over a large thickness. Furthermore, the process pressure is set preferably at 8 to 30 mTorr to reduce damages to the photoresist layer 143 in the process.

The first high-frequency power supply 101 supplies the susceptor 65 with a high-frequency power for generating plasma. This also facilitates the improvement in the plasma resistance of the photoresist layer 143 disposed as a mask layer. The frequency at this time is set preferably at 100 MHz or more. The second high-frequency power supply 102 supplies the susceptor 65 with another high-frequency power having a frequency preferably of 3 MHz or more. This makes it possible to control active species, particularly ions, in plasma. This other high-frequency power is set preferably at 100 W or less. Where the process is performed under an atmosphere of a low pressure and low power (low bias), the photoresist layer 143 disposed as a mask layer can be damaged at the minimum. Furthermore, under an atmosphere of a low pressure and low power (low bias), H radicals penetrate into the inside from the sidewall of the photoresist layer 143, so that the plasma resistance is improved over a large thickness from the sidewall surface to the inside of the photoresist layer 143. Since the photoresist layer 143 is made of an organic material and thus contains carbon, the surface reformation effect described above is remarkable. Since the ArF photoresist or F2 photoresist constituting the photoresist layer 143 changes its plasma resistance to a considerable extent between before and after the plasma resistance improvement process, the process described above has a profound effect if it is applied to a step of micro-patterning for it. During the plasma resistance improvement process, etching of the antireflective layer 142 necessary for etching of the etching objective layer is performed at the same time. In this case, the etching of the antireflective layer 142 can be performed while hardly etching the photoresist layer 143 disposed as a mask layer.

At this time, as described above, the susceptor 65 is supplied with a high-frequency power having a frequency of 100 MHz or more, whereby H$_2$ is dissociated in the process container 62 and forms various active species. Of the active species, H radicals mainly contribute to improvement in the plasma resistance of the photoresist layer 143 disposed as a mask layer, while H radicals and ions contribute to etching of the antireflective layer 142. Since the active species have a good contribution balance, it is possible to improve the plasma resistance of the photoresist layer 143 disposed as a mask layer, while effectively etching the antireflective layer 142 at the same time. Furthermore, the susceptor 65 is supplied with a high-frequency power having a frequency of 3 MHz or more from the second high-frequency power supply 102, whereby movement of ions in the active species can be controlled.

Then, the process gas is switched to an etching gas, such as a gas containing a fluorocarbon, e.g., a mixture gas of $C_4F_6$, $O_2$, and Ar, for etching the SiO$_2$ film 141 disposed as an etching objective layer. Also, high-frequency powers are applied to the susceptor 65 from the first and second high-frequency power supplies to turn the process gas into plasma, thereby etching the SiO$_2$ film 141 with the plasma, using the photoresist layer 143 as a mask.

During the etching, an end-point detector (not shown) is used to detect a predetermined light intensity, so that the etching is finished based thereon.

Also in this embodiment, the etching objective portion is not limited to the SiO$_2$ film. This may be applied to etching of oxide film (oxygen compound) such as TEOS, BPSG, PSG, SOG, thermal oxidation film, HTO, FSG, organic Si oxide film, CORAL (Novellus Systems), low dielectric constant organic insulating film, or the like. Another organic photoresist layer, or another mask layer other than photoresist may be used, in place of a photoresist material having a low plasma resistance, such as an ArF photoresist or F2 photoresist. Also, the structure of the plasma processing apparatus is not limited to that shown in FIG. 2.

Next, an explanation will be given of present examples according to this embodiment.

In the present examples, the pressure in the chamber was set at three values of 1.07 Pa (8.0 mTorr), 4.00 Pa (30 mTorr), and 13.3 Pa (100 mTorr), when $H_2$ was supplied as the process gas from the process gas supply source. The first and second high-frequency power supplies were set to have frequencies of 100 MHz and 3.2 MHz, and at powers of 2,400 W and 500 W, respectively. Evaluation was also performed in a case where no power was supplied from the second high-frequency power supply (=0 W). The evaluation was performed by observing the sectional state of the mask layer with a microscope (SEM).

As a result, when the pressure was set at 1.07 Pa (8.0 mTorr), or 4.00 Pa (30 mTorr), stripe or groove formation on the mask layer and expansion of the opening portion hardly occurred. When the pressure was set at 13.3 Pa (100 mTorr), stripe or groove formation on the mask layer and expansion of the opening portion occurred a little. As the pressure was higher, stripe or groove formation on the mask layer occurred more easily.

As regards the power supplied from the second high-frequency power supply, stripe or groove formation on the mask layer and expansion of the opening portion were less at 0 W than at 500 W. In light of these results, the power supplied from the second high-frequency power supply is set preferably at 100 W or less.

Furthermore, the flow rate of the process gas of $H_2$ was changed and set at 50 mL/min (sccm), 100 mL/min (sccm), 120 mL/min (sccm), and 200 mL/min (sccm), while the pressure was fixed at 1.07 Pa (8.0 mTorr). As a consequence, as the flow rate was lower, stripe or groove formation on the mask layer and expansion of the opening portion were less.

In the step performed thereafter of etching the $SiO_2$ film disposed as an etching objective layer, a mixture gas of $C_4F_6$, $O_2$, and Ar was supplied as the etching gas into the process container. The pressure in the process container was set at 6.66 Pa (50 mTorr). The susceptor 65 was supplied with high-frequency powers, at 600 W from the first high-frequency power supply, and at 1,800 W from the second high-frequency power supply. The high-frequency power supplied form the first high-frequency power supply turned the etching gas into plasma, thereby etching the $SiO_2$ film disposed as an etching objective layer. After the etching was finished on the basis of an end-point detection method or the like, SEM observation was similarly performed. As a result, even after the plasma etching of the etching objective layer, large reduction of the mask layer, stripe or groove formation on the mask layer, and expansion of the opening portion of the mask layer were hardly observed. Accordingly, it was confirmed that the improvement effect on the plasma resistance of the mask layer according to the present invention remained even after the plasma etching of the etching objective layer.

Fourth Embodiment

Figure 6A:
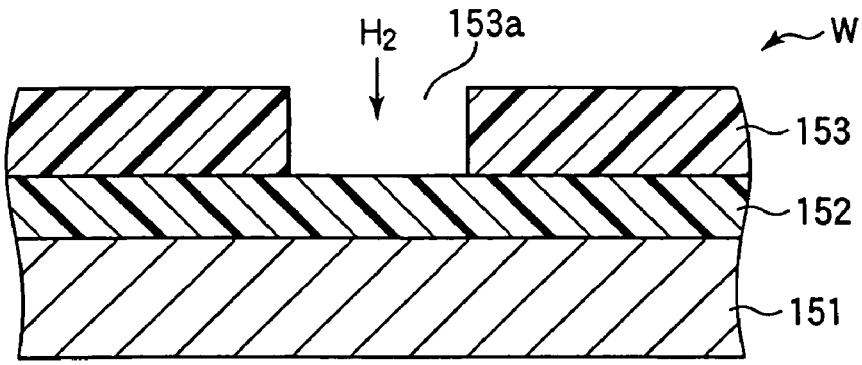
FIGS. 6A, 6B, and 6C are sectional views schematically showing states of a process subject used in a fourth embodiment of the present invention, in order of step.

In this embodiment, the plasma processing apparatus 1 shown in FIG. 1 is used to process a process subject W shown in FIG. 6A. This process subject W has an $SiO_2$ layer 151 disposed as an etching objective layer, an antireflective layer 152 covering the $SiO_2$ layer 151, and a photoresist layer 153 of an ArF photoresist or F2 photoresist disposed as a mask layer covering the antireflective layer 152 and having an opening pattern 153a formed therein. This process includes a step of etching the antireflective layer 152 through the opening pattern of the photoresist layer 153, and a step of etching the $SiO_2$ layer 151.

Also in this embodiment, the ArF photoresist or F2 photoresist may be made of an alicyclic group-containing acrylate resin, cycloolefin resin, or cycloolefin-maleic anhydride resin. As the antireflective layer, an organic polymeric material or amorphous carbon may be used.

In this embodiment, the etching steps described above are performed via three stages, i.e., a first etching step of plasma-etching the antireflective film 152 through the opening pattern 153a of the photoresist layer 153; a second etching step of etching the $SiO_2$ layer 151 halfway, through the opening pattern of the photoresist layer 153; and a third etching step of further etching the $SiO_2$ layer 151 after the second etching step. The second etching step is performed as an initial etching step for the $SiO_2$ layer 151, and the third etching step is performed as the main etching step for the $SiO_2$ layer 151.

The gate valve 32 is first opened, and the process subject W is transferred into the process container 2 and placed on the electrostatic chuck 11. Then, the gate valve 32 is closed, and the pressure in the process container 2 is reduced by the exhaust device 35. Then, the valve 28 is opened, and $H_2$ is supplied from the etching gas supply source 30, thereby setting the pressure in the process container 2 at a predetermined value. In this state, high-frequency powers are applied from the first and second high-frequency power supplies 40 and 50 to turn $H_2$ into plasma. The plasma acts on the process subject W to etch the antireflective layer 152 through the opening pattern of the photoresist layer 153 (first etching; FIG. 6A). Before or after the timing when the high-frequency powers are applied from the first and second high-frequency power supplies 40 and 50, a DC voltage is applied to the electrode 12 in the electrostatic chuck 11 from the DC power supply 13 to electrostatically attract and hold the process subject W on the electrostatic chuck 11.

During the etching, an end-point detector (not shown) is used to detect a predetermined light intensity, so that the high-frequency powers stop being supplied based thereon, and the first etching step is finished.

Figure 6B:
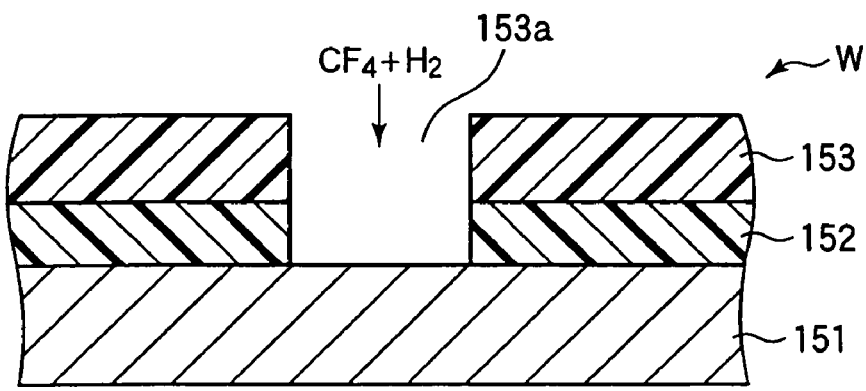
Figure 6C:
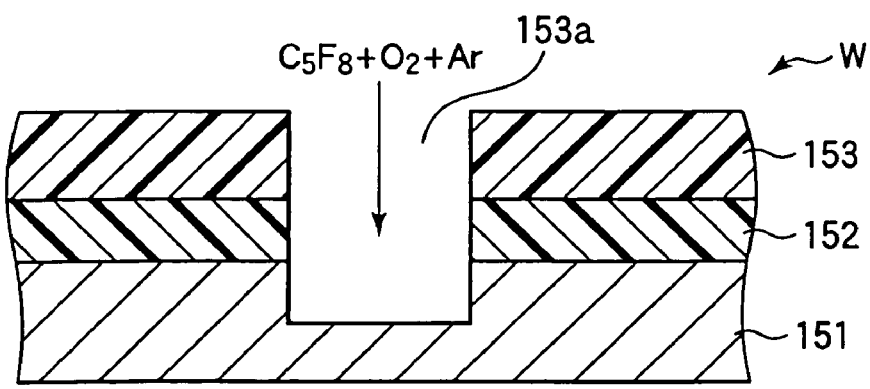

Then, using the same process container or another process container, a mixture gas of $CF_4$ and $H_2$ is supplied, as in the first etching step, to etch the $SiO_2$ layer 151 halfway, through the opening pattern of the photoresist layer 153 (second etching step; FIG. 6B). After a lapse of a predetermined etching time, such as 60 seconds, the second etching step is finished. Then, using the same process container or another process container, a gas different from the second etching step, such as a mixture gas of a straight-chain $C_5F_8$, $O_2$, and Ar, is supplied, as in the second etching step, to further etch the $SiO_2$ layer 151 (third etching step; FIG. 6C). Based on end-point detection, the third etching step is finished.

As described above, in the second etching step of etching the $SiO_2$ layer 151 by $CF_4$ and $H_2$ plasma, a protection film is formed on the surface of the ArF photoresist layer 153 disposed as a mask layer. Particularly, a larger amount of protection film is formed near the boundary between the ArF photoresist layer 153 and the $SiO_2$ layer 151. The protection film suppresses deformation of the shape of the photoresist layer 153 in the third etching step performed thereafter. Furthermore, the first etching step of etching the antireflective layer 152 by $H_2$ plasma makes it possible to more effectively suppress deformation of the shape of the photoresist layer 153 in the third etching step. This seems to be caused such that oxygen atoms are desorbed by the $H_2$ plasma from a portion near the surface of the photoresist layer 153 disposed as a mask layer, thereby forming inter-carbon bonds, which are stronger in structure.

This plasma effect of suppressing deformation of the shape of the photoresist layer 153 is prominent particularly in a case where the material is a methacrylate resin (a resin that has methacrylic acid in the structure), which can be easily deformed by plasma. However, a similar effect can be obtained for another resin, such as an acrylate resin (a resin that has acrylic acid in the structure). The acrylate resin has a relatively larger deformation-resistance among mask materials that can be micro-pattered. Accordingly, where the photoresist layer material is an acrylate resin, the first etching of etching the antireflective layer does not necessarily need to use $H_2$ gas. Alternatively, etching of the antireflective layer 152 may be performed at a high rate, using $CF_4$ plasma, which presents an etching rate higher than $H_2$, and gives the minimum damage to the mask layer among fluorocarbons.

Where a gas containing a straight-chain $C_5F_8$ and $O_2$ is used as the etching gas in the third etching step, it is possible to etch the $SiO_2$ layer 151 disposed as an etching objective layer, more anisotropically and at a higher rate. Although the etching gas in the third etching step is not limited thereto, a gas different from a mixture gas of $CF_4$ and $H_2$ used in the second etching step is preferably used. This is so, because the process gas is switched to an etching gas for the third etching step after a structure for suppressing deformation of the shape of the mask layer is formed in the second etching step. In this case, the etching gas for the third etching step may have a desired function, such as more anisotropic etching or higher rate etching. In order to etch the $SiO_2$ layer 151 more anisotropically and at a higher rate, a gas containing a fluorocarbon is preferably used as the etching gas. Particularly, a gas containing a straight-chain $C_5F_8$ and $O_2$ described above is more preferably used.

The explanation given above is made in a case where the antireflective layer 152 is disposed. If no antireflective layer is disposed, the first etching step is omitted. Specifically, the initial etching step first performed to turn $CF_4$ and $H_2$ into plasma, thereby etching halfway the $SiO_2$ layer 151 disposed as an etching objective layer, through the opening pattern of the ArF photoresist layer. After the initial etching step, the main etching step is performed to uses an etching gas preferably containing a fluorocarbon, and more preferably containing a straight-chain $C_5F_8$ and $O_2$ described above, and turn it into plasma, thereby etching the rest of the $SiO_2$ layer 151 disposed as an etching objective layer. Also in this case, a protection film is formed on the surface of the ArF photoresist layer disposed as a mask layer. Particularly, a larger amount of protection film is formed near the boundary between the ArF photoresist layer and the $SiO_2$ layer disposed as an etching objective layer. The protection film suppresses deformation of the shape of the photoresist layer in the main etching step.

Also in this embodiment, the etching objective portion is not limited to the $SiO_2$ film. This may be applied to etching of oxide film (oxygen compound) such as TEOS, BPSG, PSG, SOG, thermal oxidation film, HTO, FSG, organic Si oxide film, CORAL (Novellus Systems), low dielectric constant organic insulating film, or the like. Another organic photoresist layer, or another mask layer other than photoresist may be used, in place of a photoresist material having a low plasma resistance, such as an ArF photoresist or F2 photoresist. Also, the structure of the plasma processing apparatus is not limited to that shown in FIG. 1.

Next, an explanation will be given of present examples according to this embodiment.

Etching operations Nos. 1 to 6 were performed on a process subject, as shown in FIG. 6A, which had an antireflective layer 152 and an $SiO_2$ layer 151 disposed as an etching objective layer, using the apparatus shown in FIG. 1 under conditions shown in Table 2. In each of the etching operations, the first high-frequency power supply had a frequency of 60 MHz, and the second high-frequency power supply had a frequency of 2 MHz.

More specifically, Nos. 1 to 3 used an ArF photoresist of an acrylate resin as the photoresist layer 153, and used $C_5F_8$, $O_2$, and Ar in the third etching step. Of them, No. 1 used $CF_4$ in the first etching step, and performed no second etching step. No. 2 used $CF_4$ in the first etching step, and used $CF_4$ and $H_2$ in the second etching step. No. 3 used $H_2$ in the first etching step, and used $CF_4$ and $H_2$ in the second etching step. Nos. 4 to 6 used an ArF photoresist of a methacrylate resin as the photoresist layer 153, and used a straight-chain $C_4F_6$, $O_2$, and Ar in the third etching step. Of them, No. 4 used $CF_4$ in the first etching step, and performed no second etching step. No. 5 used $CF_4$ in the first etching step, and used $CF_4$ and $H_2$ in the second etching step. No. 6 used $H_2$ in the first etching step, and used $CF_4$ and $H_2$ in the second etching step.

After all the step ware completed, deformation of the shape of the photoresist layer 153 was examined on each of the samples obtained under the different conditions. In the examination, Nos. 1 to 3 using an acrylate resin as the photoresist layer 153 showed the following results. Specifically, in No. 1 performing no second etching step, there were vertical stripes as an indicator of deformation of the photoresist layer. In Nos. 2 and 3 performing the second etching step, there were no vertical stripes without reference to the gas used in the first etching step. On the other hand, Nos. 4 to 6 using a methacrylate resin, whose plasma resistance was lower than an acrylate resin, as the photoresist layer 153 showed the following results. Specifically, in No. 4 performing no second etching step, there were vertical stripes. In No. 5 using $CF_4$ in the first etching step and performing the second etching step, the number of vertical stripes became smaller. It was confirmed by No. 5 that the vertical stripes were suppressed by the second etching step. In No. 6 using $H_2$ as the gas in the first etching step and performing the second etching step, there were no vertical stripes. Accordingly, it was confirmed that, where the photoresist layer 153 was formed of a material having a low resistance against plasma, vertical stripes as an indicator of deformation of the photoresist layer were prevented from generating, by etching the antireflective layer 152 with $H_2$ in the first etching step, in addition to the second etching step.

TABLE 2

| | | No. | | | | | |
|---|---|---|---|---|---|---|---|
| | | 1 | 2 | 3 | 4 | 5 | 6 |
| | ArF photoresist | Acrylate Resin | | | Methacrylate Resin | | |
| First Etching | Pressure (Pa) (Value inside parentheses (mTorr)) | 6.7 (50) | 2.0 (15) | | 6.7 (50) | 2.0 (15) | |

TABLE 2-continued

| | ArF photoresist | 1 | 2 | 3 | 4 | 5 | 6 |
|---|---|---|---|---|---|---|---|
| | | Acrylate Resin | | | Methacrylate Resin | | |
| Step | Power from First High-Frequency Power Supply (W) | 1000 | 2200 | | 1000 | 2200 | |
| | Power from Second High-Frequency Power Supply (W) | 100 | 100 | | 100 | 100 | |
| | Gas and Flow Rate (mL/min) | CF$_4$: 100 | H$_2$: 100 | | CF$_4$: 100 | H$_2$: 100 | |
| Second | Pressure (Pa) | — | 2.7 | | — | 2.7 | |
| Etching | (Value inside parentheses (mTorr)) | | (20) | | | (20) | |
| Step | Power from First High-Frequency Power Supply (W) | | 1800 | | | 1800 | |
| | Power from Second High-Frequency Power Supply (W) | | 1800 | | | 1800 | |
| | Gas and Flow Rate (mL/min) | | CF$_4$: 120 | | | CF$_4$: 120 | |
| | | | H$_2$: 180 | | | H$_2$: 180 | |
| Third | Pressure (Pa) | | 6.7 | | | 2.7 | |
| Etching | (Value inside parentheses (mTorr)) | | (50) | | | (20) | |
| Step | Power from First High-Frequency Power Supply (W) | | 1800 | | | 1800 | |
| | Power from Second High-Frequency Power Supply (W) | | 1150 | | | 1800 | |
| | Gas and Flow Rate (mL/min) | | C$_4$F$_6$: 25 | | | Straight-Chain C$_5$F$_8$: 27 | |
| | | | O$_2$: 26 | | | O$_2$: 30 | |
| | | | Ar: 700 | | | Ar: 500 | |
| | Vertical Stripe | Yes | No | No | Yes | A few | No |

Fifth Embodiment

Figure 7A:
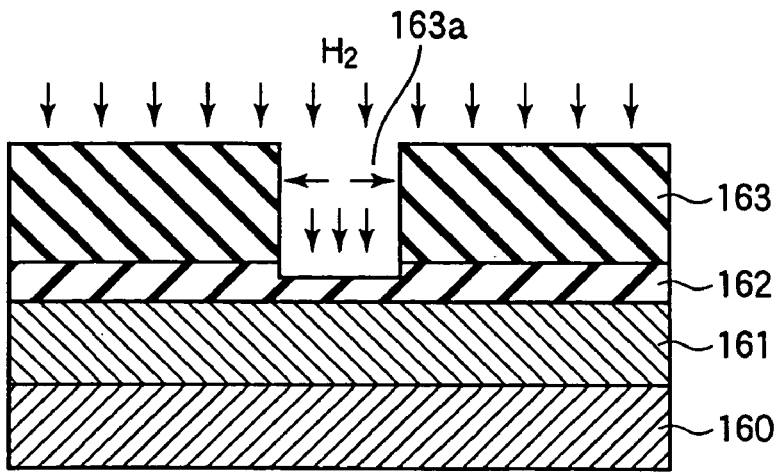
FIGS. 7A, 7B, and 7C are sectional views schematically showing states of a process subject used in a fifth embodiment of the present invention, in order of step.

In this embodiment, the plasma processing apparatus 1 shown in FIG. 1 is used to process a process subject W shown in FIG. 7A. This process subject W has an etching objective layer 161, such as an SiO$_2$ layer, (with a thickness of, e.g., 1,500 nm) disposed on an underlying layer 160 of, e.g., Si, an organic antireflective layer 162 (with a thickness of, e.g., 60 nm) covering the etching objective layer 161, and a photoresist layer 163 of an ArF photoresist or F2 photoresist covering the organic antireflective layer 162 and having an opening pattern 163a (with a diameter of, e.g., 0.18 μm) formed therein. This process includes a step of plasma-etching the organic antireflective layer 162 through the opening pattern 163a of the photoresist layer 163, and a step performed thereafter of plasma-etching the etching objective layer 161 to form an opening pattern 161a.

Figure 7B:
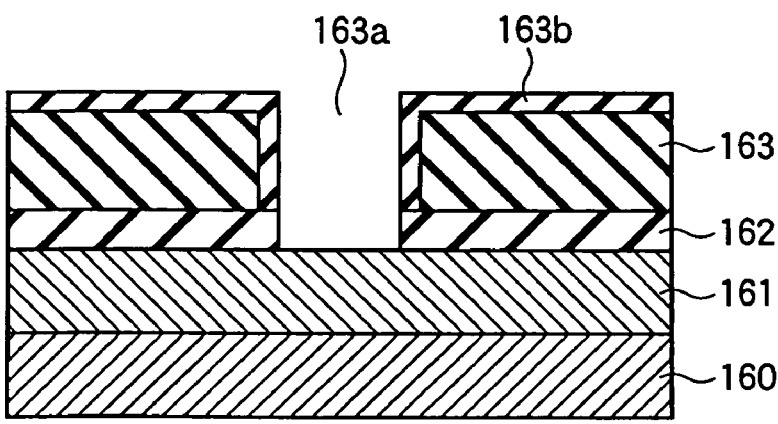
Figure 7C:
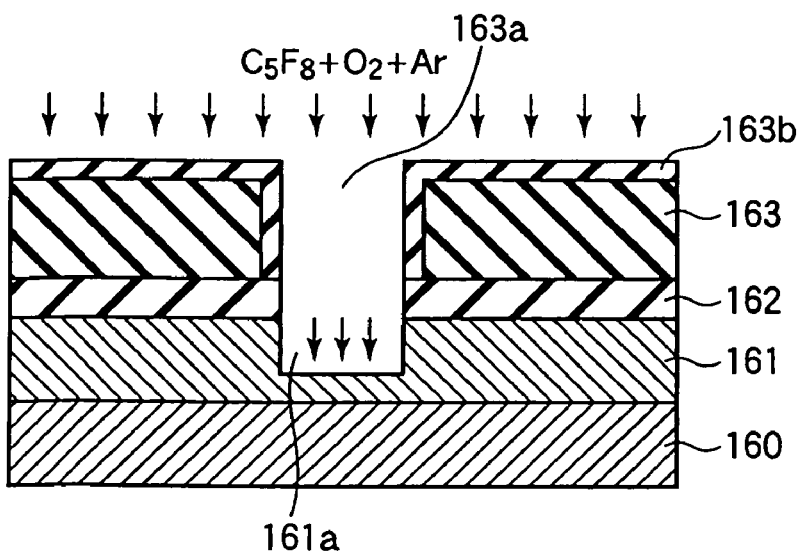
Figure 8:
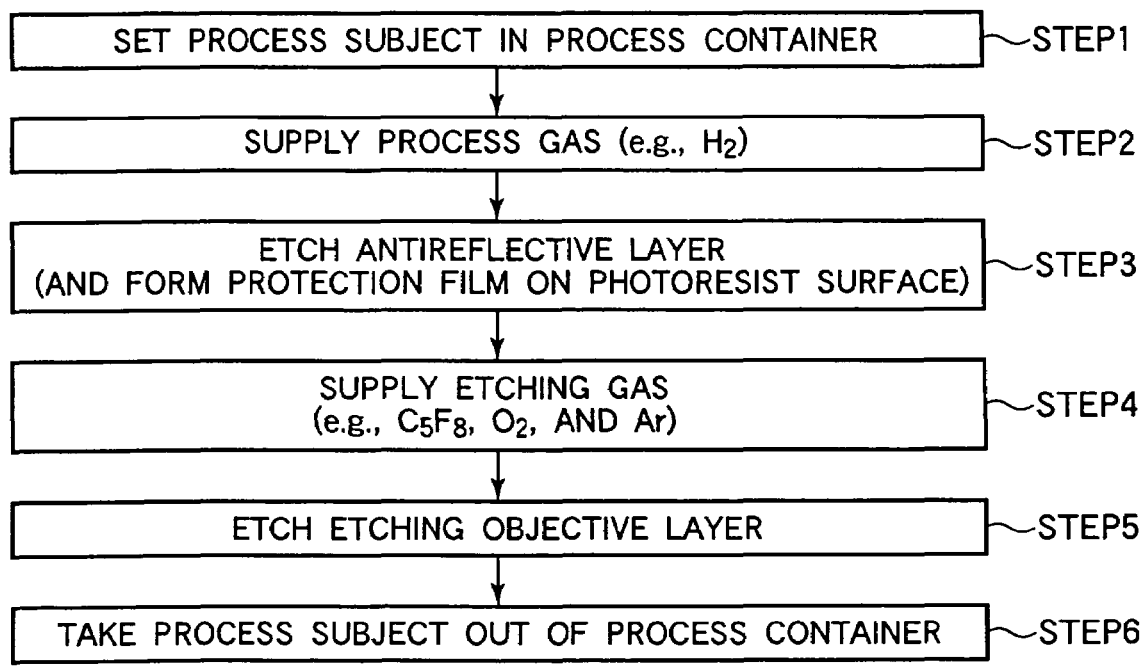
FIG. 8 is a flowchart showing a series of steps according to the fifth embodiment of the present invention.

An explanation will be given with reference to FIGS. 7A to 7C and a flowchart shown in FIG. 8.

The ArF photoresist or F2 photoresist constituting the photoresist layer 163 may be made of an alicyclic group-containing acrylate resin, cycloolefin resin, cycloolefin-maleic anhydride resin, methacrylate resin, or the like.

As the organic antireflective layer 162, an organic polymeric material may be used.

In this embodiment, the upper electrode plate 24 of the plasma processing apparatus 1 is made of a material containing Si, such as single-crystalline Si or SiC, at least at the surface thereof.

The gate valve 32 is first opened, and the process subject W is transferred into the process container 2 and placed on the electrostatic chuck 11 (STEP 1). Then, the gate valve 32 is closed, and the pressure in the process container 2 is reduced by the exhaust device 35. Then, the valve 28 is opened, and H$_2$ is supplied from the process gas supply source 30 (STEP 2), thereby setting the pressure in the process container 2 at a predetermined value.

In this state, high-frequency powers are applied from the first and second high-frequency power supplies 40 and 50 to turn H$_2$ into plasma. The plasma acts to etch the organic antireflective layer 162 through the opening pattern of the photoresist layer 163 (STEP 3) (FIG. 7A). Before or after the timing when the high-frequency powers are applied from the first and second high-frequency power supplies 40 and 50, a DC voltage is applied to the electrode 12 in the electrostatic chuck 11 to electrostatically attract and hold the process subject W on the electrostatic chuck 11. When the etching is performed for a predetermined time, the high-frequency powers and etching gas stop being supplied, so that the etching of the organic antireflective layer 162 is finished (FIG. 7B). An end-point detector (not shown) may be used to detect the light intensity of a specific substance in plasma, so that the etching step is finished based thereon.

In this embodiment, in the process of etching the organic antireflective layer 162 with H$_2$ plasma, the surface of the photoresist layer 163 receives effect of the H$_2$ plasma and Si supplied from the upper electrode plate 24, which is made of Si at least at the surface thereof. As a consequence, a thin protection layer 163b containing Si—O, Si—C, and the like is formed on the surface of the photoresist layer 163.

In other words, in the process of etching the organic antireflective layer 162 with H$_2$ plasma, the following reaction seems to occur. Specifically, it reacts with C or H in the surface of the photoresist layer 163, resulting in a state where a large number of highly reactive C and O are present in the surface of the photoresist layer 163. The highly reactive C and O react with Si supplied from the upper electrode plate 24, thereby forming the thin protection layer 163b containing substances, such as Si—C, Si—O, and the like.

As described above, in the plasma etching of the organic antireflective layer 162 through the opening pattern 163a of the photoresist layer 163, the thin protection layer 163b is formed on the surface of the photoresist layer 163. Accordingly, the plasma resistance of the photoresist layer 163 is improved, while requiring no additional step. As a consequence, in the etching of the organic antireflective layer 162, the photoresist layer 163 is prevented from suffering surface roughness increase or stripe formation, thereby maintaining a high plasma resistance thereof.

Then, using the same process container or another process container, an etching gas of, e.g., C$_5$F$_8$, O$_2$, and Ar is supplied (STEP 4), to plasma-etch the etching objective layer 161 through the opening pattern 163a of the photoresist layer 163 (STEP 5), as in the operation of etching the organic antireflective layer 162. As a consequence, an opening pattern 161a is formed in the etching objective layer 161 at a high aspect ratio, for example (FIG. 7C). After the etching of the etching objective layer 161 is completed, the process subject W is transferred out of the process container 2 through the gate valve 32 (STEP 6).

In the etching of the etching objective layer 161, according to this embodiment, the surface of the photoresist layer 163 is provided with the protection layer 163b formed thereon, and thus has a high plasma resistance. Consequently, also in the plasma etching of the etching objective layer 161, the plasma resistance of the photoresist layer 163 and the selectivity of the etching objective layer 161 relative to the photoresist layer 163 are maintained high. This makes it possible to perform the plasma etching of the etching objective layer 161 at a high etching rate, without incurring surface roughness increase or vertical stripe formation in the photoresist layer 163. As a result, in cooperation with no additional step being required, the throughput in the plasma etching step is improved. Furthermore, since no vertical stripe formation occurs on the opening pattern 163a of the photoresist layer, the opening pattern 161a can be formed in the etching objective layer 161 more accurately, using the photoresist layer 163 as a mask.

In the STEP 2 described above, He or $N_2$ may be used in place of $H_2$, in light of improvement of the plasma resistance of the photoresist layer 163. Where He or $N_2$ are used, however, the organic antireflective layer 162 is hardly etched. The organic antireflective layer 162 may be omitted, and in this case, a plasma process, using at least one of $H_2$, He, and $N_2$, exclusively performs a process of improving the plasma resistance of the photoresist layer 163.

Figure 9A:
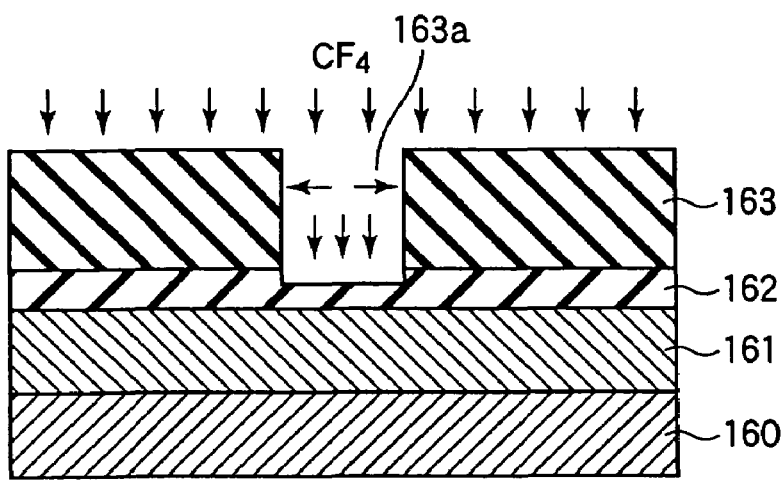
FIGS. 9A, 9B, and 9C are sectional views schematically showing states of a process subject used in a modification of the fifth embodiment of the present invention, in order of step.
Figure 9B:
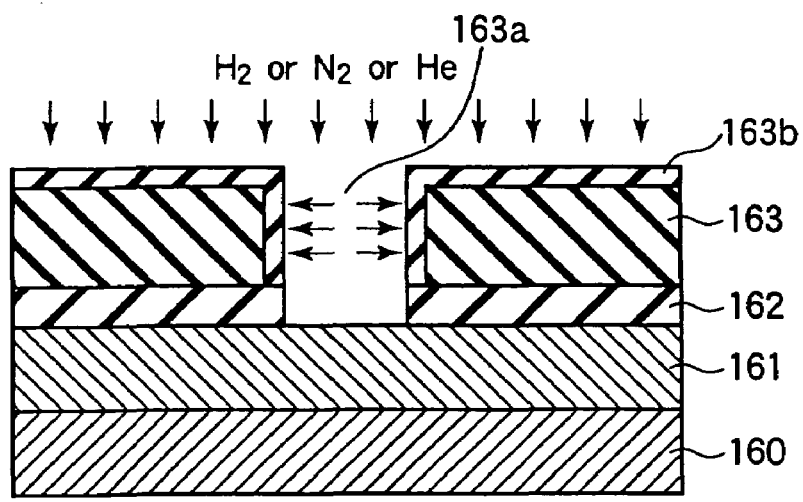
Figure 9C:
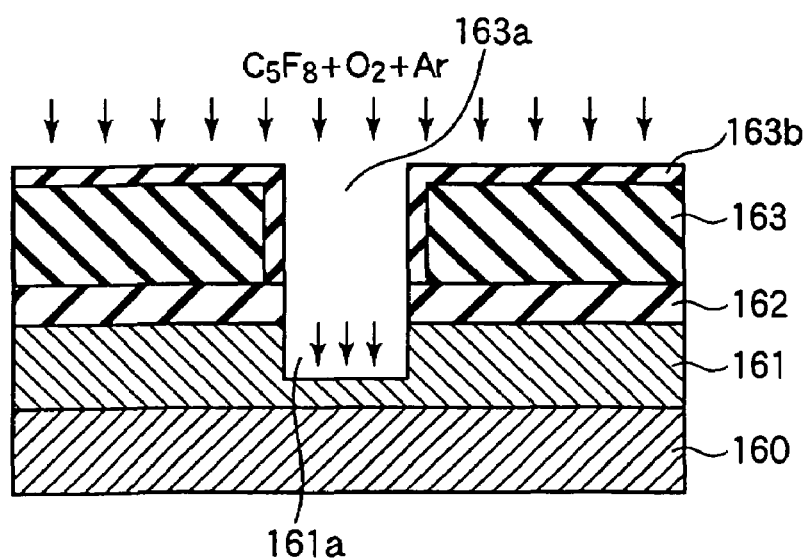
Figure 10:
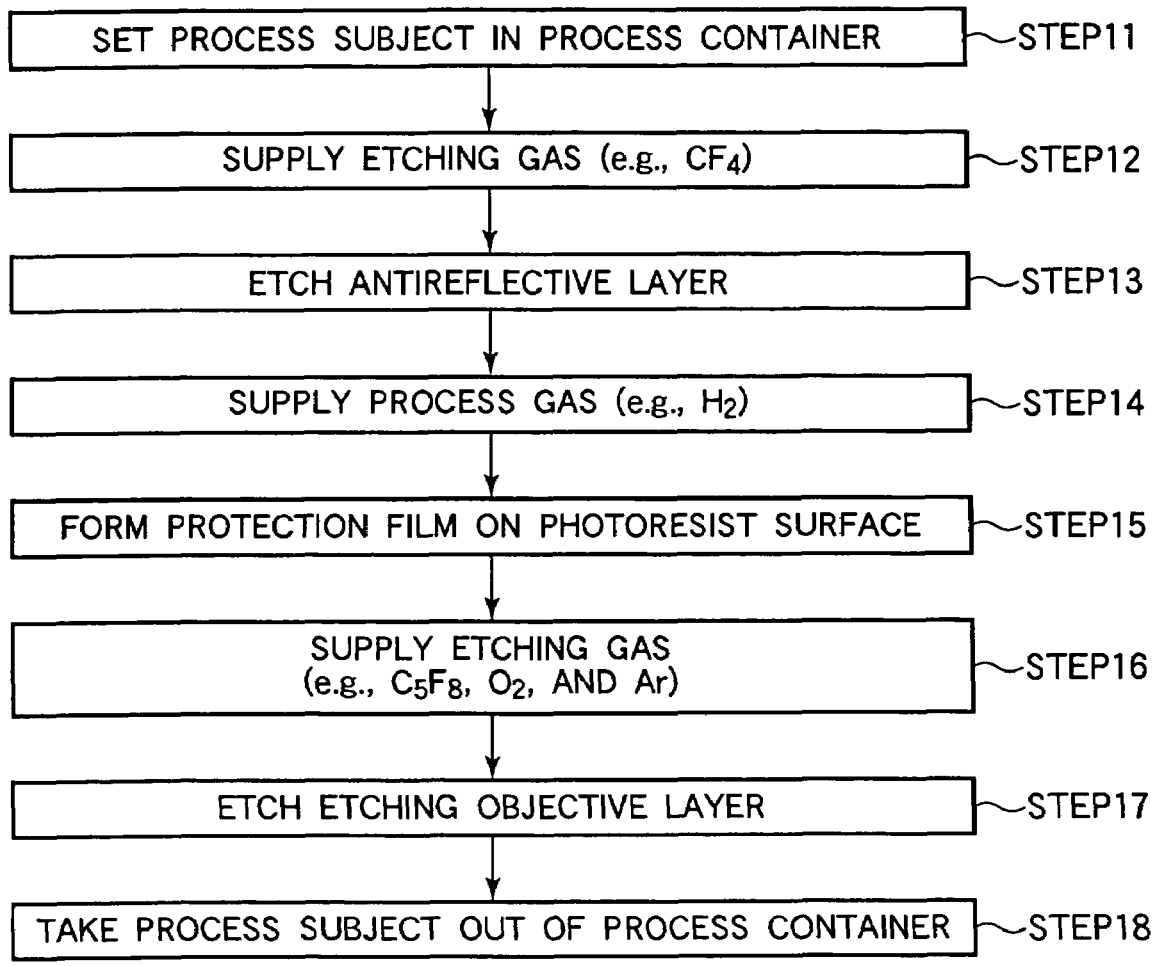
FIG. 10 is a flowchart showing a series of steps according to the modification of the fifth embodiment of the present invention.

Next, an explanation will be give of a modification according to this embodiment, with reference to FIGS. 9A to 9C and a flowchart shown in FIG. 10.

In this modification, the organic antireflective layer 162 is etched with plasma of $CF_4$ gas, and then a protection layer 163b is formed on the surface of the photoresist layer 163 by a plasma process using $H_2$ gas, before etching the etching objective layer 161.

Specifically, the gate valve 32 is first opened, and the process subject W is transferred into the process container 2 and placed on the electrostatic chuck 11 (STEP 11). Then, the gate valve 32 is closed, and the pressure in the process container 2 is reduced by the exhaust device 35. Then, the valve 28 is opened, and $CF_4$ gas is supplied from the process gas supply source 30 (STEP 12), thereby setting the pressure in the process container 2 at a predetermined value.

In this state, high-frequency powers are applied from the first and second high-frequency power supplies 40 and 50 to turn the $CF_4$ gas into plasma. The plasma acts to etch the organic antireflective layer 162 through the opening pattern of the photoresist layer 163 (STEP 13) (FIG. 9A).

Before or after the timing when the high-frequency powers are applied from the first and second high-frequency power supplies 40 and 50, a DC voltage is applied to the electrode 12 in the electrostatic chuck 11 to electrostatically attract and hold the process subject W on the electrostatic chuck 11. After the etching is performed for a predetermined time, the high-frequency powers and etching gas stop being supplied, so that the etching of the organic antireflective layer 162 is finished. An end-point detector (not shown) may be used to detect the light intensity of a specific substance in plasma, so that the etching step is finished based thereon.

Then, the gas supplied to the process container 2 is switched to $H_2$ gas (STEP 14) to turn the $H_2$ gas into plasma, so that the surface of the photoresist layer 163 receives the effect of $H_2$ plasma and Si supplied from the upper electrode plate 24, for a predetermined time. As a consequence, a thin protection layer 163b containing Si—O, Si—C, and the like is formed on the surface of the photoresist layer 163 (STEP 15) (FIG. 9B).

In other words, according to this modification, in the plasma process for the photoresist layer 163, the following reaction seems to occur. Specifically, it reacts with C or H in the surface of the photoresist layer 163, resulting in a state where a large number of highly reactive C and O are present in the surface of the photoresist layer 163. The highly reactive C and O react with Si supplied from the upper electrode plate 24 to from Si—C and Si—O, thereby forming the thin protection layer 163b. The thin protection layer 163b containing Si—C, Si—O, and the like improves the plasma resistance of the photoresist layer 163.

Then, using the same process container or another process container, an etching gas of, e.g., $C_5F_8$, Ar, and $O_2$ is supplied (STEP 16), to plasma-etch the etching objective layer 161 through the opening pattern 163a of the photoresist layer 163 (STEP 17), as in the operation of etching the organic antireflective layer 162. As a consequence, an opening pattern 161a is formed at a high aspect ratio, for example (FIG. 9C). After the etching of the etching objective layer 161 is completed, the process subject W is transferred out of the process container 2 through the gate valve 32 (STEP 18).

In the etching of the opening pattern 161a in the etching objective layer 161, according to this modification, the surface of the photoresist layer 163 is provided with the protection layer 163b formed thereon, as described above, and thus has a high plasma resistance. Consequently, the plasma resistance of the photoresist layer 163 and the etching selectivity relative to the mask are maintained high. This makes it possible to form the opening pattern 161a by plasma etching at a high etching rate, without incurring surface roughness increase or vertical stripe formation in the photoresist layer 163. As a result, in cooperation with no additional step being required, the throughput in the plasma etching step is improved.

When the protection layer 163b is formed in the STEP 15 described above, $N_2$ or He may be used in place of or along with $H_2$.

In this embodiment, the etching objective layer 161 is not limited to Si oxide, the representative of which is $SiO_2$ described above as an example. This embodiment may be applied to another Si compound, such as Si nitride or Si carbide, single-crystalline Si, poly-crystalline Si, organic material, organic-inorganic hybrid material, metal, or metal compound. Furthermore, this embodiment is particularly effective to a photoresist material having a low plasma resistance, such as an ArF photoresist or F2 photoresist described above as an example, but it is not limited thereto. Even where this embodiment is applied to another organic photoresist layer, such as an EB resist to be handled with electron beam lithography, an EUV resist to be handled with vacuum ultraviolet ray lithography, or a KrF resist, the same effect can be obtained. Furthermore, this embodiment may be applied to a mask layer other than a photoresist layer. Also, the structure of the plasma processing apparatus is not limited to that shown in FIG. 1.

In the explanation, the upper electrode plate is used as an Si source for forming the protection layer, but it is not limited thereto. A component in the process container, such as an focus ring, shield ring, or inner chamber, may be prepared to contain Si at least in the surface thereof, to use it as an Si source for the same. However, the upper electrode plate is preferably used, because it is disposed to face the process subject, and thus has an advantage such that the process of improving the plasma resistance can be uniformly performed over the surface of the process subject.

Next, an explanation will be given of present examples according to this embodiment.

In the present examples and comparative example described below, the frequencies of the first high-frequency power supply 40 and second high-frequency power supply 50 were set at 60 MHz and 13.56 MHz, respectively.

(1) [Plasma Process of Photoresist Layer]

Present examples 1 to 3 and a comparative example 1 were performed, using a photoresist layer covering an etching objective layer and having an opening pattern formed therein. The present examples 1 to 3 were set to turn $H_2$, $N_2$, and He, respectively, into plasma to perform a plasma process. The comparative example 1 was set to turn Ar into plasma to perform a plasma process. In each of the examples, the plasma process was performed for one minute, and the photoresist layer was made of an ArF photoresist.

PRESENT EXAMPLE 5-1

Pressure in process container: 2.01 Pa (15 mTorr)
High-frequency power from first high-frequency power supply: 2,200 W
High-frequency power from second high-frequency power supply: 100 W
Process gas and flow rate: $H_2$ at 0.1 L/min (100 sccm)

PRESENT EXAMPLE 5-2

Pressure in process container: 2.01 Pa (15 mTorr)
High-frequency power from first high-frequency power supply: 2,200 W
High-frequency power from second high-frequency power supply: 100 W
Process gas and flow rate: $N_2$ at 0.1 L/min (100 sccm)

PRESENT EXAMPLE 5-3

Pressure in process container: 2.01 Pa (15 mTorr)
High-frequency power from first high-frequency power supply: 2,200 W
High-frequency power from second high-frequency power supply: 100 W
Process gas and flow rate: He at 0.1 L/min (100 sccm)

COMPARATIVE EXAMPLE 5-1

Pressure in process container: 2.01 Pa (15 mTorr)
High-frequency power from first high-frequency power supply: 2,200 W
High-frequency power from second high-frequency power supply: 100 W
Process gas and flow rate: Ar at 0.1 L/min (100 sccm)

Figure 11A:
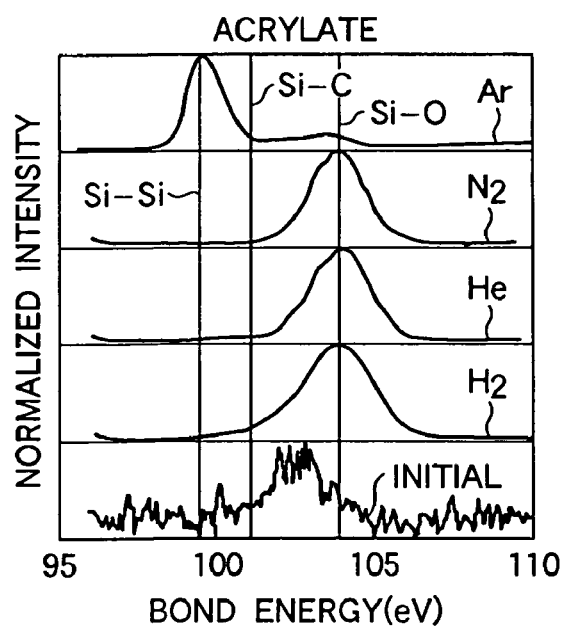
FIGS. 11A and 11B are charts showing effects of a plasma process according to a present example of the fifth embodiment of the present invention.
Figure 11B:
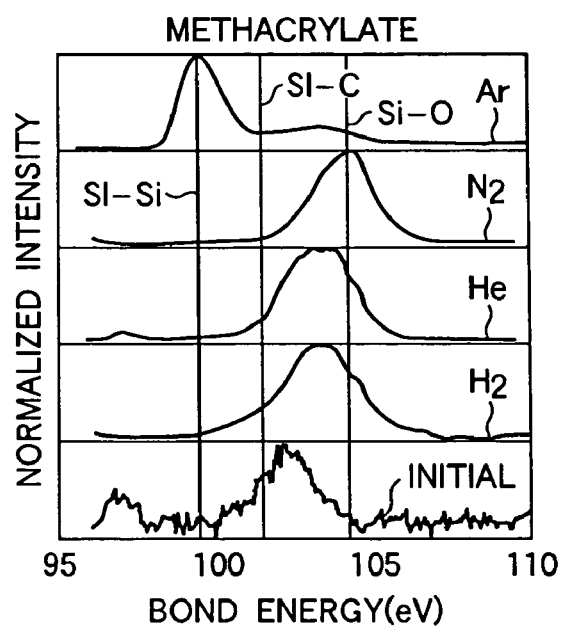

FIGS. 11A and 11B are views showing surface analysis results (charts respectively shown with $H_2$, $N_2$, He, and Ar) of photoresist layers made of acrylate and methacrylate ArF photoresists, respectively, immediately after a plasma process thereon. As shown in FIGS. 11A and 11B, in each of the present examples 5-1 to 5-3, it was observed that a protection layer containing substances having bond energy corresponding to Si—O, Si—C, and the like was present on the surface of the photoresist layer, by the plasma process with plasma of $H_2$, $N_2$, or He on either the acrylate or methacrylate ArF photoresist.

On the other hand, in the comparative example 5-1 of performing a plasma process with Ar, only deposition of Si supplied from the upper electrode plate was observed on either the acrylate or methacrylate ArF photoresist.

The plasma resistance was improved also by the deposition of Si on the surface of the photoresist layer. In this case, however, a problem occasionally arose in that deposition of Si occurred near a hole in the etching objective layer after ashing. For this reason, it was confirmed that $H_2$, $N_2$, or He is preferably used in this plasma process.

(2) [Plasma Process of Photoresist Layer After Etching of Organic Antireflective Layer]

An process subject W, which had an etching objective layer, an organic antireflective layer covering the etching objective layer, and a photoresist layer covering the organic antireflective layer and having an opening pattern formed therein, was used. Etching was performed on the organic antireflective layer under the following conditions, and then a plasma process was performed on the photoresist layer 163 under conditions the same as those in the present examples 5-1 to 5-3 and comparative example 5-1 (FIGS. 9A and 9B, and STEP 11 to STEP 15 in FIG. 10).

Pressure in process container: 6.7 Pa (50 mTorr)
High-frequency power from first high-frequency power supply: 1,000 W
High-frequency power from second high-frequency power supply: 100 W
Etching gas and flow rate: $CF_4$ at 0.1 L/min (100 sccm)

Then, etching was performed on the etching objective layer 161 under the following conditions (FIG. 9C, and STEP 16 to STEP 18 in FIG. 10).

Pressure in process container: 2.01 Pa (15 mTorr)
High-frequency power from first high-frequency power supply: 2,170 W
High-frequency power from second high-frequency power supply: 1,550 W
Etching gas and flow rate:
c-$C_5F_8$ at 0.015 L/min (15 sccm)
Ar at 0.380 L/min (380 sccm)
$O_2$ at 0.019 L/min (19 sccm)

After performing the etching of the etching objective layer, the sectional shape of the etched portion of the process subject was observed by means of electron micrograph. As a result, in any of process subjects where a plasma process was performed on the photoresist layer of an ArF photoresist with $H_2$. $N_2$. He, or Ar, surface roughness increase or vertical stripe formation were hardly observed in the photoresist layer. On the other hand, in a process subject where no plasma process was performed on the photoresist layer in the step described above, surface roughness increase and vertical stripe formation were observed in the photoresist layer.

In the case of performing a plasma process on the photoresist layer after the etching of the organic antireflective layer and before the etching of the etching objective layer, surface roughness increase and vertical stripe formation in the ArF photoresist layer were less after the etching of the etching objective layer, as compared to the case of performing a plasma process on the photoresist layer 163 before the etching of the organic antireflective layer and the etching of the etching objective layer. Accordingly, the throughput and etching accuracy can be improved by using $CF_4$ plasma, which provides a high etching rate and a relatively low damage, in the etching of the organic antireflective layer, and then performing the plasma process of the ArF photoresist layer and the etching of the etching objective layer in this order.

Sixth Embodiment

Figure 12:
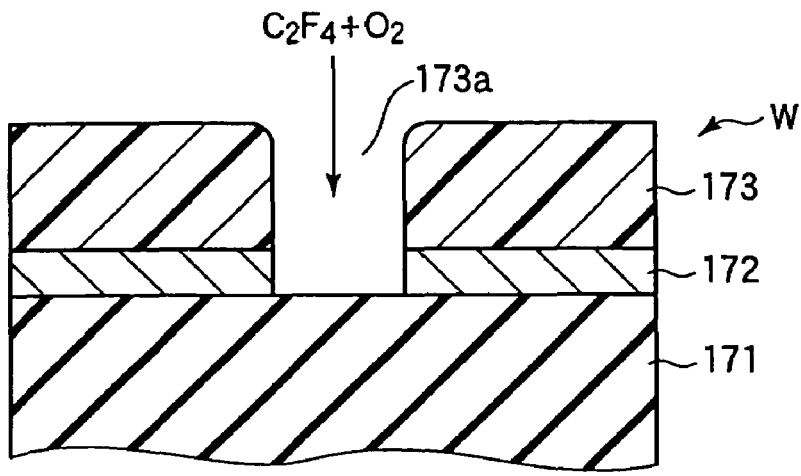
FIG. 12 is a sectional view schematically showing a process subject used in a sixth embodiment of the present invention.

In this embodiment, the plasma processing apparatus 1 shown in FIG. 1 is used to process a process subject W shown in FIG. 12. This process subject W has an underlying layer 171 of e.g., $SiO_2$, an antireflective layer 172 covering the underlying layer 171, and a photoresist layer 173 of an ArF photoresist or F2 photoresist covering the antireflective layer 172 and having an opening pattern formed therein. This process includes a step of plasma-etching the antireflective layer 172 through the opening pattern 173a of the photoresist mask layer 173. Also in this embodiment, the ArF photoresist or F2 photoresist may be made of an alicyclic group-containing acrylate resin, cycloolefin resin, or cycloolefin-maleic anhydride resin. As the antireflective layer 172, either an inorganic or organic material, such as amorphous carbon, which is a carbon-containing material, or an organic polymeric material, can be used.

In order to perform the etching, the gate valve 32 is first opened, and the process subject W is transferred into the process container 2 and placed on the electrostatic chuck 11. Then, the gate valve 32 is closed, and the pressure in the process container 2 is reduced by the exhaust device 35. Then, the valve 28 is opened, and the process gas described above, such as $C_2F_4$ and $O_2$, is supplied from the etching gas supply source 30, thereby setting the pressure in the process container 2 at a predetermined value.

In this state, high-frequency powers are applied to the upper electrode 21 and the lower electrode or susceptor 5 to turn the process gas into plasma. The plasma acts on the process subject W to etch the antireflective layer 172 through the opening pattern 173a of the photoresist layer 173. Before or after the timing when the high-frequency powers are applied to the upper and lower electrodes, a DC voltage is applied to the electrode 12 in the electrostatic chuck 11 to electrostatically attract and hold the process subject W on the electrostatic chuck 11.

During the etching, an end-point detector (not shown) is used to detect a predetermined light intensity, so that the etching is finished based thereon.

In this embodiment, as described above, the etching of the antireflective layer 172 is performed through the photoresist layer 173, using a process gas containing $C_2F_4$, such as a process gas containing $C_2F_4$ and $O_2$— As a consequence, it is possible to suppress surface roughness increase of the photoresist layer 173, maintain a high selectivity of the antireflective layer relative to the photoresist layer, and obtain a high etching rate of the antireflective layer 172.

In this embodiment, the present invention is not limited to the manner described above, but may be modified in various manners. For example, the etching objective layer is not limited to the antireflective layer described above, but may be applied to another layer to be etched. The process gas containing $C_2F_4$ is not limited to the process gas containing $C_2F_4$ and $O_2$. Furthermore, where the process gas containing $C_2F_4$ and $O_2$ is used, the mask layer is not limited to ArF photoresist or F2 photoresist, but may be made of another photoresist layer, or may be formed of a mask layer other than photoresist. Also, the structure of the etching apparatus is not limited to that shown in FIG. 1.

Next, an explanation will be given of present examples according to this embodiment.

The present examples were prepared to employ the following conditions. Specifically, the pressure in the process container was set at 1.33 Pa (10 mTorr) or 6.66 Pa (50 mTorr); the flow ratio between $C_2F_4$ and $O_2$ in the process gas at $C_2F_4$: $O_2$=5:2, 3:2, 5:4, 1:1, or 3:4; a high-frequency power having a frequency of 60 MHz applied to the upper electrode at 600, 1,000, or 1,400 W; and a high-frequency power having a frequency of 2 MHz applied to the lower electrode at 100 W.

On the other hand, a comparative example was prepared to employ the following conditions. Specifically, the pressure in the process container was set at 6.66 Pa (50 mTorr); the process gas was $CF_4$; a high-frequency power having a frequency of 60 MHz applied to the upper electrode at 1,000 W; and a high-frequency power having a frequency of 2 MHz applied to the lower electrode at 100 W.

The etching under the conditions described above arrived at the following results. Specifically, the present examples did not differ so much from the comparative example in the selectivity of the antireflective layer relative to the ArF photoresist mask layer (the etching rate of the antireflective layer/ the etching rate of the ArF photoresist mask layer). However, the present examples showed etching rates of the antireflective layer, 1.2 to 3.6 times that of the comparative example. In the present example, as well as the comparative example, the surface of the ArF photoresist mask layer did not become rough. Accordingly, it was confirmed that the present examples allowed the etching of the antireflective film to be performed at a high etching rate, without causing the ArF photoresist mask layer to suffer surface roughness increase.

Seventh Embodiment

Figure 13A:
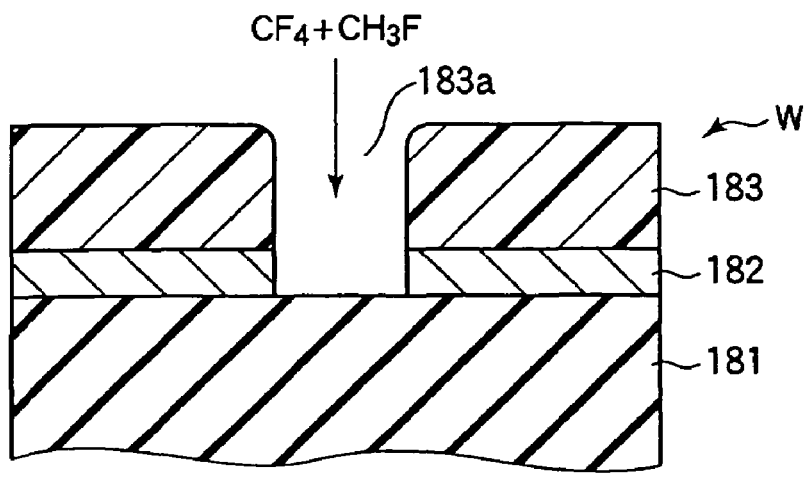
FIGS. 13A and 13B are sectional views schematically showing states of a process subject used in a seventh embodiment of the present invention, in order of step.

In this embodiment, the plasma processing apparatus 1 shown in FIG. 1 is used to process a process subject W shown in FIG. 13A. This process subject W has an $SiO_2$ layer 181 disposed as an etching objective, an antireflective layer 182 covering the $SiO_2$ layer 181, and a photoresist layer 183 of an ArF photoresist or F2 photoresist covering the antireflective layer 182. This process includes a step of etching the antireflective layer 182 through an opening pattern 183a of the photoresist mask layer 183, and a step performed thereafter of etching the $SiO_2$ layer 181. Also in this embodiment, the ArF photoresist or F2 photoresist may be made of an alicyclic group-containing acrylate resin, cycloolefin resin, or cycloolefin-maleic anhydride resin. As the antireflective layer, an organic polymeric material or amorphous carbon may be used.

The gate valve 32 is first opened, and the process subject W is transferred into the process container 2 and placed on the electrostatic chuck 11. Then, the gate valve 32 is closed, and the pressure in the process container 2 is reduced by the exhaust device 35. Then, the valve 28 is opened, and an etching gas containing a substance having C and F and a substance having H is supplied from the process gas supply source 30, thereby setting the pressure in the process container 2 at a predetermined value, such as 6.66 Pa (50 mTorr). In this state, high-frequency powers are applied to the upper electrode 21 and the lower electrode or susceptor 5 to turn the etching gas into plasma, thereby etching the antireflective layer 182 on the process subject W (FIG. 13A). As a consequence, the remaining film quantity of the photoresist layer 183 becomes large after the etching of the antireflective layer 182, thereby allowing a hole or groove formed in the following etching step of the etching objective portion to have a desired opening shape.

An example of a substance having C and F used in this etching is $CF_4$, with which the ArF photoresist layer is less damaged. As a substance having H, a hydrocarbon, $H_2$, or hydrofluorocarbon may be used. An example of a hydrocarbon is $CF_4$. A preferable hydrofluorocarbon is a substance, in which the ratio of the number of H atoms relative to the number of F atoms is three or more, and an example of such a substance is $CH_3F$. Where $CH_3F$ is used, the ratio of the flow rate of $CH_3F$ relative to the flow rate of a substance having C and F is set at 0.04 to 0.07 in the etching gas. With this arrangement, the remaining film quantity of the ArF photoresist layer is considerably increased after the etching of the antireflective layer, as compared to the case of using no $CH_3F$.

Before or after the timing when the high-frequency powers are applied to the upper and lower electrodes, a DC voltage is applied from the DC power supply 13 to the electrode 12 in the electrostatic chuck 11 to electrostatically attract and hold the process subject W on the electrostatic chuck 11. After the etching of the antireflective layer 182 described above is finished, the etching gas and high-frequency powers stop being supplied.

Figure 13B:
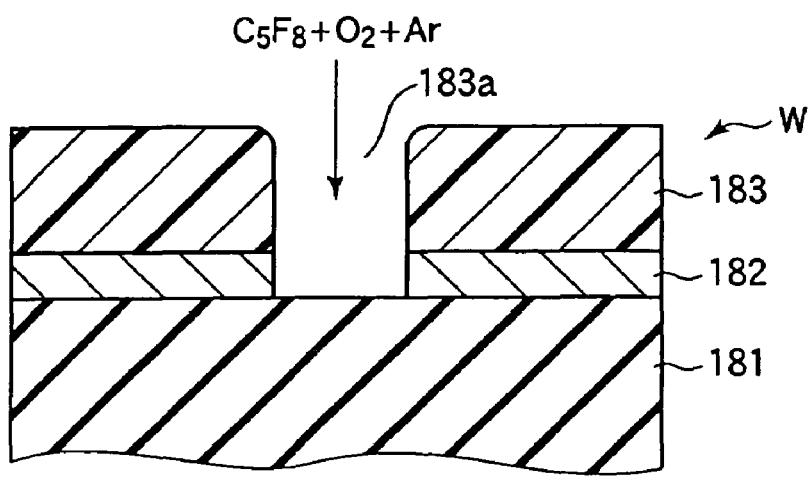

Then, another etching gas, such as a mixture gas of $C_5F_8$, $O_2$, and Ar, is supplied into the process container 2, thereby setting the pressure in the process container 2 at a predetermined value, such as 2.00 Pa (15 mTorr). Also, high-frequency powers are applied to the upper electrode 21 and the lower electrode or susceptor 5 to turn the etching gas into plasma, thereby etching the $SiO_2$ layer 181 on the process subject W (FIG. 13B). During the etching, an end-point detector (not shown) is used to detect a predetermined light intensity, so that the etching is finished based thereon.

The etching objective portion is not limited to the $SiO_2$ layer described above. This may be applied to etching of oxide film (oxygen compound) such as TEOS, BPSG, PSG, SOG, thermal oxidation film, HTO, FSG, organic Si oxide film, CORAL (Novellus Systems), low dielectric constant organic insulating film, or the like. Also, the structure of the plasma processing apparatus used is not limited to that shown in FIG. 1.

Next, an explanation will be given of present examples according to this embodiment.

The process subject W used had an $SiO_2$ layer (with a film thickness of 2 µm), an antireflective layer (with a film thickness of 60 nm) covering the $SiO_2$ layer, and an ArF photoresist layer (with a film thickness of 360 nm) covering the antireflective layer, as shown in FIG. 13A.

In the present examples, the etching of the antireflective layer was performed under the following conditions. Specifically, the pressure in the process container 2 was set at 6.66 Pa (50 mTorr); the etching gas was a mixture gas of $CF_4$ (at a flow rate of 100 mL/min (sccm)) and $CH_3F$ (at a flow rate of 4 or 7 mL/min (sccm)); a high-frequency power applied to the upper electrode from a high-frequency power supply having a frequency of 60 MHz at 1,000 W; and a high-frequency power applied to the lower electrode from a high-frequency power supply having a frequency of 2 MHz at 100 W. Furthermore, $CH_3F$ was replaced with $H_2$ (at a flow rate of 5, 10, or 15 mL/min (sccm)), $CH_2F_2$ (at a flow rate of 5 or 10 mL/min (sccm)), or $CHF_3$ (at a flow rate of 10, 30, 50, or 70 mL/min (sccm)) in the etching gas to perform the same etching.

On the other hand, a comparative example was prepared to use an etching gas only of $CF_4$ (at a flow rate of 100 mL/min (sccm)), while using the other etching conditions the same as those of the present examples.

The etching of the antireflective film 182 was performed under the conditions described above according to the present examples and comparative example. After a lapse of a constant etching time, a remaining film thickness of the ArF photoresist layer was measured, which showed the following results.

In the present examples, where $CH_3F$ was used, a flow rate of 4 mL/min resulted in 375 nm, and 7 mL/min resulted in 405 nm. Where $H_2$ was used, a flow rate of 5 mL/min resulted in 345 nm, and 10 mL/min and 15 mL/min resulted in 360 nm. Where $CH_2F_2$ was used, a flow rate of 5 mL/min resulted in 345 nm, and 10 mL/min resulted in 400 nm. Where $CHF_3$ was used, a flow rate of 10 mL/min resulted in 350 nm, 30 mL/min resulted in 360 nm, 50 mL/min resulted in 360 nm, and 70 mL/min resulted in 390 nm. On the other hand, the comparative example resulted in 330 nm.

As described above, it was confirmed that any of the present examples showed a remaining film thickness larger than the comparative example. This reason seems that F active species for etching the ArF photoresist layer suitably reacted with H active species generated from a gas containing H, and formed gases, such as HF, which were then exhausted out of the process container.

Of the present examples, $CH_3F$ was particularly excellent. In this case, the reason of a large remaining film quantity in spite of a low flow rate of $CH_3F$ seems to be attributed to the number of H atoms larger than the number of F atoms in molecules. In the case of $H_2$, the remaining film quantity was smaller than other substances. This is so, because $H_2$ is a chemically stable substance, and H active species once generated seem to preferentially react and re-combine with other H active species, rather than reacting with F active species.

Accordingly, it was confirmed that the etching gas preferably contained a substance that was relatively unstable and had a lot of H atoms therein, such as a hydrocarbon ($CH_4$, $C_2H_4$, or the like) or hydrofluorocarbon (particularly a composition in which the ratio of the number of H atoms relative to the number of F atoms is three or more, such as $CH_3F$). It was also confirmed that, where $CH_3F$ was used, the remaining film quantity was increased, even if the ratio of the flow rate of $CH_3F$ relative to the flow rate of $CF_4$, i.e., a substance having C and F, was set at a low value of 0.04 to 0.07.

Eighth Embodiment

Figure 14A:
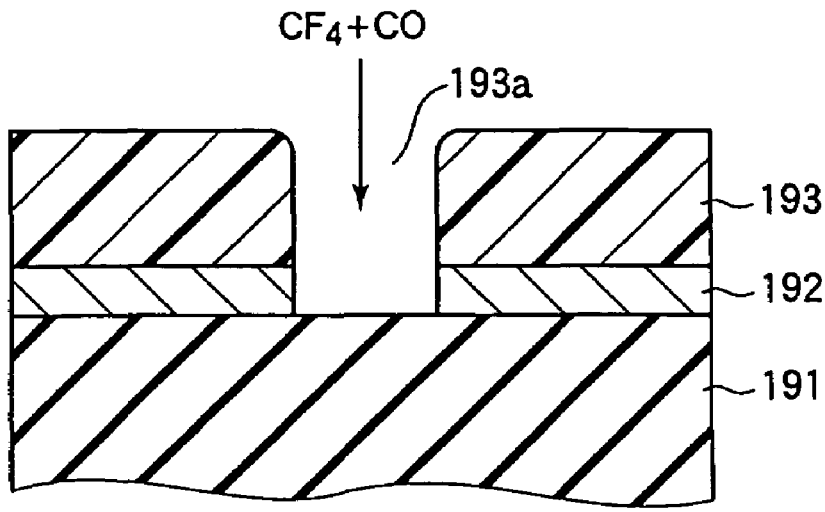
FIGS. 14A and 14B are sectional views schematically showing states of a process subject used in an eighth embodiment of the present invention, in order of step.

In this embodiment, the plasma processing apparatus 1 shown in FIG. 1 is used to process a process subject W shown in FIG. 14A. This process subject W has an $SiO_2$ layer 191 disposed as an etching objective, an antireflective layer 192 covering the $SiO_2$ layer 191, and a photoresist layer 193 of an ArF photoresist or F2 photoresist covering the antireflective layer 192. This process includes a step of etching the antireflective layer 192 through an opening pattern 193a of the photoresist layer 193, and a step performed thereafter of etching the $SiO_2$ layer 191. Also in this embodiment, the ArF photoresist or F2 photoresist may be made of an alicyclic group-containing acrylate resin, cycloolefin resin, or cycloolefin-maleic anhydride resin. As the antireflective layer, an organic polymeric material or amorphous carbon may be used.

The gate valve 32 is first opened, and the process subject W is transferred into the process container 2 and placed on the electrostatic chuck 11. Then, the gate valve 32 is closed, and the pressure in the process container 2 is reduced by the exhaust device 35. Then, the valve 28 is opened, and a first etching gas containing a substance having C and F, and CO, such as a mixture gas of $CF_4$ and CO, is supplied from the process gas supply source 30, thereby setting the pressure in the process container 2 at a predetermined value, such as 13.3 Pa (100 mTorr). In this state, high-frequency powers are applied to the upper electrode 21 and the lower electrode or susceptor 5 to turn the first etching gas into plasma, thereby etching the antireflective layer 192 on the process subject W (FIG. 14A). Before or after the timing when the high-frequency powers are applied to the upper and lower electrodes, a DC voltage is applied from the DC power supply 13 to the electrode 12 in the electrostatic chuck 11 to electrostatically attract and hold the process subject W on the electrostatic chuck 11. After the etching of the antireflective layer 192 is finished, the etching gas and high-frequency powers stop being supplied.

Figure 14B:
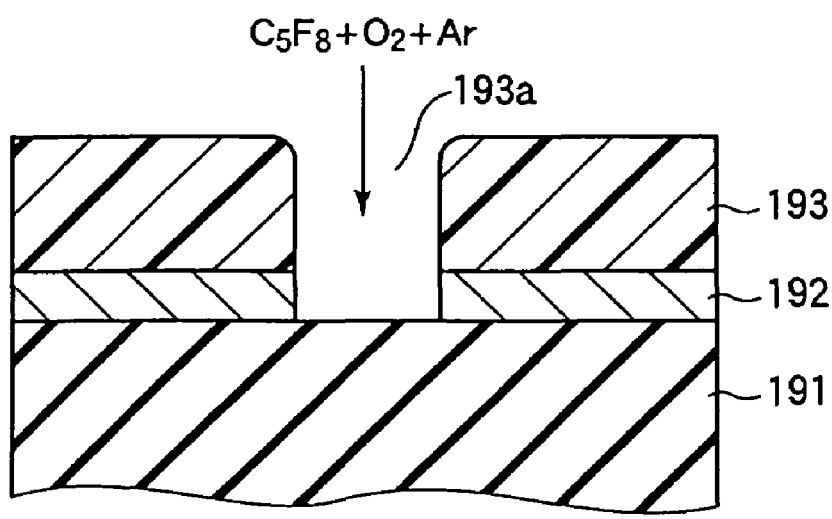

Then, a second etching gas, such as a gas containing a fluorocarbon, e.g., $C_5F_8$ or $C_4F_6$, specifically a mixture gas of $C_5F_8$ or $C_4F_6$, $O_2$, and Ar, is supplied into the process container 2, thereby setting the pressure in the process container 2 at a predetermined value of the second etching, such as 2.00 Pa (15 mTorr). Also, high-frequency powers are applied to the upper electrode 21 and the lower electrode or susceptor 5 to turn the second etching gas into plasma, thereby etching the $SiO_2$ layer 191 on the process subject W (FIG. 14B). During the etching, an end-point detector (not shown) is used to detect a predetermined light intensity, so that the etching is finished based thereon.

The etching objective portion is not limited to the $SiO_2$ layer described above. This may be applied to etching of oxide film (oxygen compound) such as TEOS, BPSG, PSG, SOG, thermal oxidation film, HTO, FSG, organic Si oxide film, CORAL (Novellus Systems), low dielectric constant organic insulating film, or the like. Also, the structure of the plasma processing apparatus used is not limited to that shown in FIG. 1.

Next, an explanation will be given of present examples according to this embodiment.

A process subject used was prepared as shown in FIG. 14A. In the present examples, the first etching was performed under the following conditions. Specifically, the pressure in the process container was set at 6.66 Pa (50 mTorr) or 13.3 Pa (100 mTorr); the flow rate of the first etching gas $CF_4$ at 75, 100, or 200 mL/min (sccm) and CO at 25, 100, or 200 mL/min (sccm); a high-frequency power applied to the upper electrode from a high-frequency power supply having a frequency of 60 MHz at 1,000, 1,500, or 2,000 W; and a high-frequency power applied to the lower electrode from a high-frequency power supply having a frequency of 2 MHz at 100 W.

In a comparative example, the first etching was performed under the following conditions. Specifically, the pressure in the process container was set at 6.66 Pa (50 mTorr), the first etching gas was only of $CF_4$ (no CO contained) at a flow rate of 100 mL/min (sccm), and high-frequency power supplies were used with the same frequencies and at the same powers as those of the present examples.

In the present examples and comparative example, the second etching was performed under the following conditions. Specifically, the pressure in the process container was set at 2.00 Pa (15 mTorr); the flow rate of the second etching gas $C_5F_8$, $O_2$, and Ar respectively at 15, 19, and 380 mL/min (sccm); a high-frequency power applied to the upper electrode from a high-frequency power supply having a frequency of 60 MHz at 2,170 W; and a high-frequency power applied to the lower electrode from a high-frequency power supply having a frequency of 2 MHz at 1,550 W.

The first etching and second etching were performed under the conditions described above, which gave the following results. Specifically, the present examples were far better than the comparative example in the selectivity of the $SiO_2$ layer relative to the ArF photoresist layer (the etching rate of the $SiO_2$ layer/the etching rate of the ArF photoresist layer). For example, in the present examples, where the first etching was performed under conditions with the pressure set at 13.3 Pa (100 mTorr), the $CF_4$ flow rate at 75 mL/min (sccm), the CO flow rate at 25 mL/min (sccm), and the applied power to the upper electrode at 1,000 W, the selectivity was 9.7. On the other hand, in the comparative example, the selectivity was 6.3.

Where $C_5F_8$ was replaced with $C_4F_6$ in the second etching step, the present examples (the first etching gas was $CF_4$ and CO) were better than the comparative example (the first etching gas was only $CF_4$) in the selectivity.

It seems that a protection film having inter-carbon bonds is formed on the surface of the ArF photoresist layer by plasma of a gas containing a substance having C and F, and CO. Accordingly, the plasma resistance of the ArF photoresist layer is improved only by irradiating the surface of the ArF photoresist layer with plasma of a gas containing a substance having C and F, and CO.

The present invention may be applied to a mask layer other than the ArF photoresist layer, although plasma resistance improvement effect cannot be expected so much, as compared to the ArF photoresist layer.

Furthermore, the second etching gas is not limited to a gas containing $C_5F$. or $C_4F_6$, but may be formed of a gas containing another fluorine-containing compound, such as a fluorocarbon or hydrofluorocarbon.

Ninth Embodiment

Figure 15:
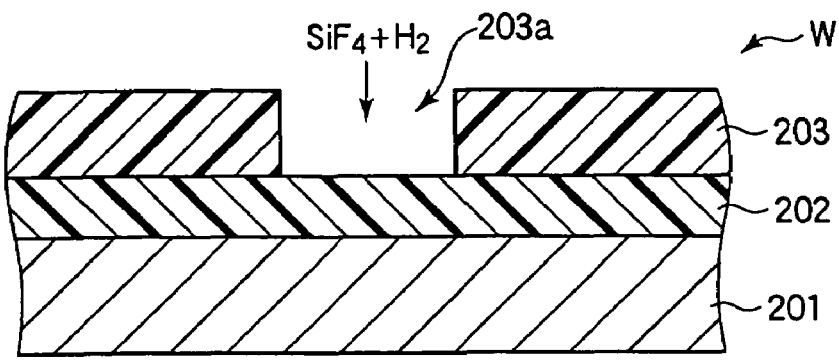
FIG. 15 is a sectional view schematically showing a process subject used in a ninth embodiment of the present invention.

In this embodiment, the plasma processing apparatus 1 shown in FIG. 1 is used to process a process subject W shown in FIG. 15. This process subject W has an $SiO_2$ layer 201 disposed as an etching objective, an organic antireflective layer 202 covering the $SiO_2$ layer 201, and a photoresist layer 203 of an ArF photoresist or F2 photoresist covering the organic antireflective layer 202 and having an opening pattern 203a formed therein. This process includes a step of plasma-etching the organic antireflective layer 202 through the opening pattern of the photoresist layer 203, and a step performed thereafter of plasma-etching the $SiO_2$ layer 201. Also in this embodiment, the ArF photoresist or F2 photoresist may be made of an alicyclic group-containing acrylate resin, cycloolefin resin, or cycloolefin-maleic anhydride resin. The organic antireflective layer 202 is made of, e.g., an organic polymeric material.

The gate valve 32 is first opened, and the process subject W is transferred into the process container 2 and placed on the electrostatic chuck 11. Then, the gate valve 32 is closed, and the pressure in the process container 2 is reduced by the exhaust device 35. Then, the valve 28 is opened, and an etching gas containing $SiF_4$ used as an Si-containing substance is supplied from the etching gas supply source 30, thereby setting the pressure in the process container 2 at a predetermined value. In place of $SiF_4$, another substance having Si may be used, but $SiF_4$ is preferable to obtain a high etching rate of the organic antireflective layer 202. The etching gas may contain $CHF_3$, HBr, He, or $H_2$ in addition to an Si-containing substance, and may consist of, e.g., $SiF_4$ and $H_2$.

In this state, high-frequency powers are applied from the first and second high-frequency power supplies 40 and 50 to turn the etching gas into plasma, thereby etching the organic antireflective layer 202 through the opening pattern 203a of the photoresist layer 203. Before or after the timing when the high-frequency powers are applied from the first and second high-frequency power supplies 40 and 50, a DC voltage is applied to the electrode 12 in the electrostatic chuck 11 to electrostatically attract and hold the process subject W on the electrostatic chuck 11. After the etching is performed for a predetermined time, the high-frequency powers and etching gas stop being supplied, so that the etching of the organic antireflective layer 202 is finished. An end-point detector (not shown) may be used to detect a predetermined light intensity, so that the etching step is finished based thereon.

Then, using the same process container or another process container, plasma etching of the $SiO_2$ layer 201 is performed through the opening pattern 203a of the photoresist layer, as in the operation of etching the organic antireflective layer 202. The etching gas used at this time is a gas of, e.g., $C_4F_6$, $O_2$, and Ar, but it is not limited thereto.

As described above, when the plasma etching of the organic antireflective film 202 is performed through the opening pattern of the photoresist layer 203, $SiF_4$ gas, which is a gas containing Si, is used. In this etching, a thin cured layer containing Si is formed on the surface of the photoresist layer 203, thereby improving the plasma resistance of the photoresist layer 203. As a consequence, during the etching of the organic antireflective layer 202, it does not suffer surface roughness increase or vertical stripe formation. In other words, the photoresist layer 203 of an ArF photoresist or F2 photoresist, which originally has a low plasma resistance, can maintain a high plasma resistance. In this case, where the etching gas for the organic antireflective layer 202 contains $H_2$, C=O bonds in the surface of the photoresist layer 203 are converted into C—C bonds or C=C bonds, which are chemically stronger. As a result, in cooperation with the thin cured layer containing Si, which is formed on the surface of the photoresist layer 203, the plasma resistance can be further improved.

Furthermore, as described above, after the etching of the organic antireflective layer 202, the etching of the $SiO_2$ layer 201 disposed as an etching objective layer is performed through the opening pattern 203a of the photoresist layer 203. Since the plasma resistance of the photoresist layer 203 is improved during the etching of the organic antireflective layer 202, the plasma resistance remains high also in the plasma etching of the $SiO_2$ layer 201 disposed as an etching objective. As a consequence, the plasma etching can be performed, without incurring surface roughness increase or vertical stripe formation in the photoresist layer.

The etching objective layer is not limited to Si oxide, the representative of which is $SiO_2$ described above as an example. This embodiment may be applied to another Si compound, such as Si nitride or Si carbide, single-crystalline Si, poly-crystalline Si, organic material, organic-inorganic hybrid material, metal, or metal compound. Also, the structure of the plasma processing apparatus is not limited to that shown in FIG. 1.

Next, an explanation will be given of present examples according to this embodiment.

A process subject having the structure shown in FIG. 15 was used. Etching of the organic antireflective layer was performed, using various etching gas containing a substance having Si (present examples 9-1 to 9-7). Also, etching of the organic antireflective layer was performed, using various etching gas containing no substance having Si (comparative examples 9-1 and 9-2).

In the present examples and comparative examples, the first high-frequency power supply and second high-frequency power supply had frequencies of 60 MHz and 13.56 MHz, respectively. After the etching of the organic antireflective layer performed under the following conditions according to the present examples and comparative examples, plasma etching of the $SiO_2$ layer was performed under etching conditions described later.

Etching of Organic Antireflective Layer

PRESENT EXAMPLE 9-1

Pressure in process container: 0.67 Pa (5 mTorr)
High-frequency power from first high-frequency power supply: 300 W
High-frequency power from second high-frequency power supply: 60 W
Etching gas and flow rate:
$SiF_4$ at 0.08 L/min (80 sccm)

PRESENT EXAMPLE 9-2

Pressure in process container: 6.7 Pa (50 mTorr)
High-frequency power from first high-frequency power supply: 700 W
High-frequency power from second high-frequency power supply: 100 W
Etching gas and flow rate:
$SiF_4$ at 0.1 L/min (100 sccm)

PRESENT EXAMPLE 9-3

Pressure in process container: 0.67 Pa (5 mTorr)
High-frequency power from first high-frequency power supply: 300 W
High-frequency power from second high-frequency power supply: 60 W
Etching gas and flow rate:
$SiF_4$ at 0.04 L/min (40 sccm)
$CHF_3$ at 0.04 L/min (40 sccm)

PRESENT EXAMPLE 9-4

Pressure in process container: 0.67 Pa (5 mTorr)
High-frequency power from first high-frequency power supply: 300 W
High-frequency power from second high-frequency power supply: 60 W
Etching gas and flow rate:
$SiF_4$ at 0.04 L/min (40 sccm)
HBr at 0.04 L/min (40 sccm)

PRESENT EXAMPLE 9-5

Pressure in process container: 0.67 Pa (5 mTorr)
High-frequency power from first high-frequency power supply: 300 W
High-frequency power from second high-frequency power supply: 60 W
Etching gas and flow rate:
$SiF_4$ at 0.04 L/min (40 sccm)
He at 0.04 L/min (40 sccm)

PRESENT EXAMPLE 9-6

Pressure in process container: 0.67 Pa (5 mTorr)
High-frequency power from first high-frequency power supply: 300 W
High-frequency power from second high-frequency power supply: 60 W
Etching gas and flow rate:
$SiF_4$ at 0.04 L/min (40 sccm)

HBr at 0.02 L/min (20 sccm)
He at 0.02 L/min (20 sccm)

PRESENT EXAMPLE 9-7

Pressure in process container: 6.7 Pa (50 mTorr)
High-frequency power from first high-frequency power supply: 1,000 W
High-frequency power from second high-frequency power supply: 100 W
Etching gas and flow rate:
$SiF_4$ at 0.03 L/min (30 sccm)
$H_2$ at 0.02 L/min (20 sccm)

COMPARATIVE EXAMPLE 9-1

Pressure in process container: 0.93 Pa (7 mTorr)
High-frequency power from first high-frequency power supply: 100 W
High-frequency power from second high-frequency power supply: 250 W
Etching gas and flow rate:
$CF_4$ at 0.072 L/min (72 sccm)
$CHF_3$ at 0.026 L/min (26 sccm)
$O_2$ at 0.006 L/min (6 sccm)

COMPARATIVE EXAMPLE 9-2

Pressure in process container: 6.7 Pa (50 mTorr)
High-frequency power from first high-frequency power supply: 1,000 W
High-frequency power from second high-frequency power supply: 100 W
Etching gas and flow rate:
$CF_4$ at 0.1 L/min (100 sccm)
Etching of $SiO_2$ Layer PRESENT EXAMPLES 9-1,9-3 to 9-6, AND COMPARATIVE EXAMPLE 9-1

Pressure in process container: 16 Pa (120 mTorr)
High-frequency power from first high-frequency power supply: 550 W
High-frequency power from second high-frequency power supply: 350 W
Etching gas and flow rate:
$CF_4$ at 0.1 L/min (100 sccm)
$CHF_3$ at 0.06 L/min (60 sccm)

PRESENT EXAMPLES 9-2 AND 9-7, AND COMPARATIVE EXAMPLE 9-2

Pressure in process container: 2.7 Pa (20 mTorr)
High-frequency power from first high-frequency power supply: 1,800 W
High-frequency power from second high-frequency power supply: 1,150 W
Etching gas and flow rate:
$C_4F_6$ at 0.025 L/min (25 sccm)
$O_2$ at 0.026 L/min (26 sccm)
Ar at 0.7 L/min (700 sccm)

After performing the etching of the $SiO_2$ layer 201, as described above, the sectional shape of the etched portion of the process subject W was observed by means of electron micrograph in each of the present examples and comparative examples. As a result, in any of the present examples 9-1 to 9-7, the ArF photoresist layer 203 hardly showed surface roughness increase or vertical stripe formation. On the other hand, in any of the comparative examples 9-1 and 9-2, the ArF photoresist layer 203 showed surface roughness increase and vertical stripe formation.

Tenth Embodiment

Figure 16A:
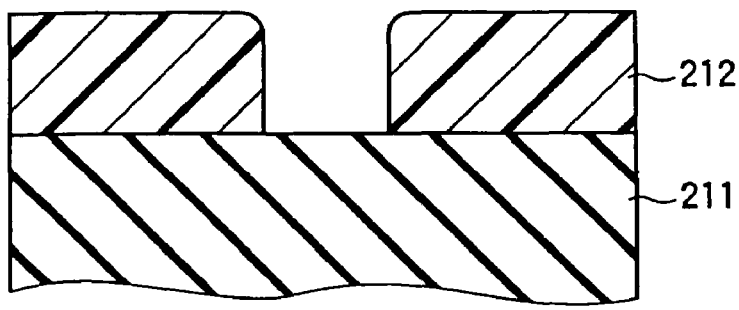
FIGS. 16A and 16B are sectional views schematically showing states of a process subject used in a tenth embodiment of the present invention, in order of steps

In this embodiment, the plasma processing apparatus 1 shown in FIG. 1 is used to subject a process subject W shown in FIG. 16A to a series of steps described below. This process subject W has an etching objective layer 211 consisting of Si oxide, a representative of which is an $SiO_2$ film, and a mask layer 212 of an ArF photoresist or F2 photoresist covering the etching objective layer 211. Also in this embodiment, the ArF photoresist or F2 photoresist may be made of an alicyclic group-containing acrylate resin, cycloolefin resin, cycloolefin-maleic anhydride resin, methacrylate resin or the like. In this embodiment, the showerhead or upper electrode plate 24 of the apparatus shown in FIG. 1 is made of Si.

The gate valve 32 is first opened, and the process subject W is transferred into the process container 2 and placed on the electrostatic chuck 11. Then, the gate valve 32 is closed, and the pressure in the process container 2 is reduced by the exhaust device 35. Then, the valve 28 is opened, and an inert gas, such as Ar, is supplied from the process gas supply source 30, thereby setting the pressure in the process container 2 at, e.g., 1.33 Pa (10 mTorr). As the inert gas, another gas, such as Kr or Xe, may be used. In this state, high-frequency powers are applied from the first and second high-frequency power supplies 40 and 50 to the upper electrode 21 and the lower electrode or susceptor 5 to ionize at least part of the inert gas, thereby sputtering the Si upper electrode plate 24. Before or after the timing when the high-frequency powers are applied to the upper and lower electrodes, a DC voltage is applied from DC power supply 13 to the electrode 12 in the electrostatic chuck 11 to electrostatically attract and hold the process subject W on the electrostatic chuck 11.

Figure 16B:
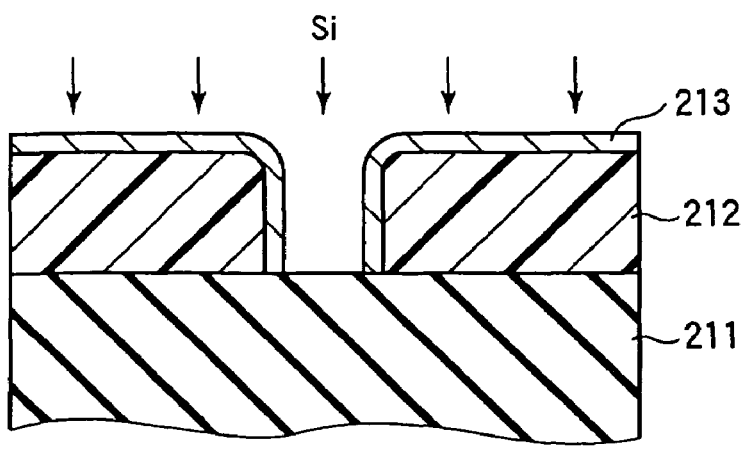

At this time, the high-frequency power applied to the upper electrode 21 provides energy for urging ionization of the inert gas. By sputtering the Si upper electrode plate 24, as described above, an Si-containing layer 213 is formed on the surface of the mask layer 212, as shown in FIG. 16B. If the time used to form Si-containing layer 213 on the surface of the mask layer 212 is too short, the plasma resistance improvement effect can be hardly obtained. If the time is too long, a lot of Si-containing layer is formed on the surface of the etching objective layer 211 in the opening portion of the mask layer 212, and hinders the etching performed thereafter. Accordingly, it is preferable to select an appropriate value of the time. For example, this step may adopt conditions in which the upper electrode 21 is supplied with a high-frequency power having a frequency of 60 MHz at a power of 2,000 W, while the susceptor 5 is supplied with a high-frequency power having a frequency of 2 MHz at a power of 100 W. Under the conditions, it was confirmed that a range of 60 to 90 seconds was preferable for the processing time described above.

As regards the powers, the conditions described above reduced variation in the opening shape of the mask layer when the Si-containing layer was formed, as compared to a case where the power applied to the upper electrode was set at 1,250 W, and the power applied to the susceptor was set at 400 W (a so-called low $V_{PP}$). If the $V_{PP}$ is too high, the opening of the mask layer is expanded, thereby making it difficult to form holes or grooves in accordance with the designed opening pattern in the following etching step.

After the formation of the Si-containing layer on the surface of the mask layer is finished, the high-frequency powers stop being supplied.

Then, an etching gas is supplied into the process container 2, and high-frequency powers are applied to the upper electrode 21 and susceptor 5, to etch the etching objective layer 211. For example, where the etching objective layer 211 consists of Si oxide, a gas containing at least one selected from $C_4F_6$, $C_4F_8$, and $C_5F_8$ is preferably used. An example of such an etching gas is a mixture gas of $C_4F_6$, $O_2$, and Ar. The pressure in the process container 2 is set at, e.g., 2.67 Pa (20 mTorr), and the high-frequency powers applied to the upper electrode 21 and susceptor 5 are set at, e.g., 1,600 W and 800 W, respectively. The frequencies of the high-frequency powers at this time are set at, e.g., 60 MHz and 2 MHz, respectively, as in the sputtering. The high-frequency powers are applied to turn the etching gas into plasma, thereby etching the etching objective layer 211 consisting of e.g., Si oxide. After the etching is finished, the etching gas and high-frequency powers stop being supplied.

The etching of the etching objective layer 211 of Si oxide was performed under the conditions described above. As a result, the selectivity of the etching objective layer 211 relative to the mask layer 212 (the etching rate of the etching objective layer/the etching rate of the mask layer) was 28.8. Where the etching was performed without the Si-containing layer formed on the surface of the mask layer 212, the selectivity was 8.2.

The etching performed as described above is followed by a step (ashing step) of removing the mask layer 212 with the Si-containing layer formed on the surface thereof. In this example, a plurality of stages are used to remove the mask layer 212 with the Si-containing layer 213 formed on the surface thereof.

In the first stage, a gas containing fluorine, such as $CF_4$, is supplied into the process container 2, and high-frequency powers are applied to the upper electrode 21 and susceptor 5 for a predetermined time, to remove almost all the Si-containing layer 213 formed on the mask layer 212. This is done, because, if the Si-containing layer is left, Si-containing products may stick to the surface of the process subject after the mask layer 212 is removed in the next second stage. At this time, the pressure in the process container 2 is set at, e.g., 6.66 Pa (50 mTorr), and the high-frequency powers applied to the upper electrode 21 and susceptor 5 are set at, e.g., 1,600 W and 800 W, respectively, and have frequencies of, e.g., 60 MHz and 2 MHz, respectively, as in the sputtering. This process is performed under the conditions for, e.g., 90 seconds, to remove almost all the Si-containing layer 213.

Where a gas containing $CF_4$, and $O_2$ and Ar added thereto was used at this stage, the mask layer 212 of an ArF photoresist was damaged. Accordingly, it is preferable to use a gas containing only $CF_4$, or a gas containing $CF_4$ with a small amount of $O_2$ and Ar added thereto.

As a fluorine compound-containing gas, a gas other than $CF_4$ may be used. However, $CF_4$ is preferably used to suppress damage to the mask layer 212 of an ArF photoresist below the Si-containing layer 213.

In the second stage, a predetermined process gas is supplied, and high-frequency powers applied to the upper electrode 21 and the lower electrode or susceptor 5, to remove the mask layer 212 itself, in a state where almost all the Si-containing layer 213 has been removed. At this time, as a process gas, it is preferable to use a gas containing no fluorine compound, such as $O_2$ gas only, or to use a mixture gas containing $O_2$, $N_2$, and Ar, or a mixture gas containing $O_2$, $N_2$, and $H_2$.

A process according to this second stage was actually performed. In this case, the pressure, high-frequency powers, high-frequency power supply frequencies were not changed from the first stage, but only the process gas was changed, to perform ashing. $O_2$ was used as the process gas. The process subject was observed after the mask layer 212 was removed. As a result, the opening shape and sectional shape of holes and grooves accorded with the design. Furthermore, there was no Si-containing product sticking to the process subject.

In this embodiment, as described above, an inert gas is ionized by energy of high-frequency powers applied to the parallel-plate electrodes, to sputter the Si upper electrode plate 24. At this time, an Si-containing layer sticking to the surface of the mask layer 212 is formed to improve the plasma resistance of the mask layer 212 to be far better than that of the mask layer it self. Particularly, where the mask layer 212 is made of an ArF photoresist or F2 photoresist, which has a low plasma resistance, the plasma resistance improvement effect is remarkable.

In the ashing performed after the etching of the etching objective layer, a plurality of stages are performed to remove the Si-containing layer 213 and the mask layer 212 itself separately from each other. Accordingly, the removal operations can be respectively performed in accordance with the natures of the Si-containing layer 213 and mask layer. As a matter of course, the Si-containing layer 213 and mask layer 212 may be removed together. It is determined which to use, based on comparison in the total advantages and disadvantages between the removal using a plurality of stages and the removal performed at once.

A target used in sputtering to form the Si-containing layer on the mask layer is not limited to the upper electrode plate described above as an example. The target may be another member, such as a focus ring, disposed in the process container and made of Si at least at a part of the surface. An Si member may be additionally disposed as the target. Another Si wafer having undergone no device processes (bare wafer) may be placed in the process container to use it as the target. Single-crystalline Si is preferable as Si of the target used in the sputtering.

In the example described above, the sputtering is performed in a parallel-plate type apparatus for plasma etching, using high-frequency energy, but it is not limited thereto. Another structure may be adopted, as long as the structure can apply energy to ionize at least part of an inert gas. For example, microwave energy may be used in place of high-frequency energy as the energy for the same. Even where high-frequency energy is used, a system of applying a high-frequency power from an antenna to form an induction electromagnetic field may be used, in place of the parallel-plate type.

A method of forming the Si-containing layer 213 on the surface of the mask layer 212 is not limited to sputtering. For example, CVD may be used to form the Si-containing layer 213 on the surface of the mask layer 212. Where CVD is used to form the Si-containing layer 213, an organic silane group gas or inorganic silane group gas may be used as a raw material gas. Of them, an inorganic silane group gas is preferable. In this case, CVD can be performed with the gas, in accordance with a common procedure.

A method of adding an Si compound, such as $SiF_4$, to the etching gas may be adopted as a method of forming the Si-containing layer 213 on the surface of the mask layer 212. With this arrangement, it is possible to improve the plasma resistance of the mask layer 212 of an ArF photoresist or F2 photoresist, and to etch the etching objective layer 211, at the same time.

In this embodiment, the etching objective layer is not limited to Si oxide described above. The etching objective layer may be selected from various materials, such as SiC, SiN, organic low dielectric constant material, SiOF, metal, and metal compound. It should be noted, however, since the layer formed on the surface of the mask layer contains Si as the main component, it is difficult to apply this embodiment to a process subject that includes an Si etching objective layer. This is so, because, where the mask layer surface and etching objective layer consist of the same material, their etching rates become almost the same. The mask layer is not limited to a photoresist material having a low plasma resistance, such as an ArF photoresist or F2 photoresist. Another organic photoresist layer, or another mask layer other than photoresist may be used.

Eleventh Embodiment

Figure 17A:
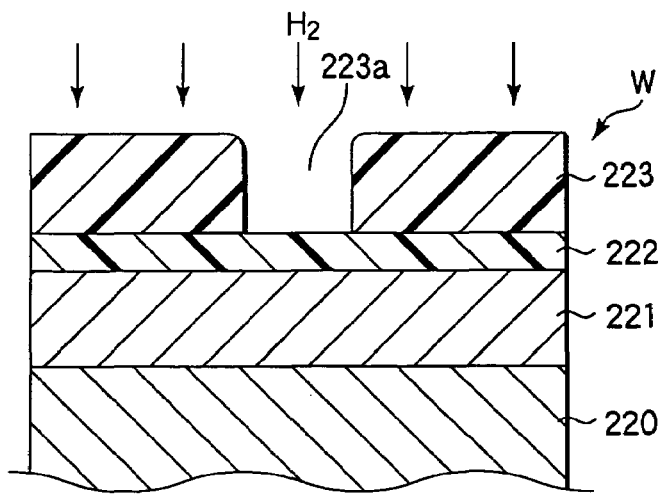
FIGS. 17A to 17C are sectional views schematically showing states of a process subject used in a eleventh embodiment of the present invention, in order step.

In this embodiment, the plasma processing apparatus 1 shown in FIG. 1 is used to process a process subject W shown in FIG. 17A. This process subject W has an etching objective layer 221, such as an $SiO_2$ layer (with a thickness of, e.g., 1,500 nm) disposed on an underlying layer 220 of, e.g., Si, an organic antireflective layer 222 (with a thickness of, e.g., 60 nm) covering the etching objective layer 221, and a photoresist layer 223 of an ArF photoresist or F2 photoresist covering the antireflective layer 222 and having an opening pattern 223a (with a diameter of, e.g., 0.18 μm) formed therein. This process includes a step of plasma-etching the antireflective layer 222 through the opening pattern 223a of the photoresist layer 223, and a step performed thereafter of plasma-etching the etching objective layer 221 to form an opening pattern 221a.

Figure 17B:
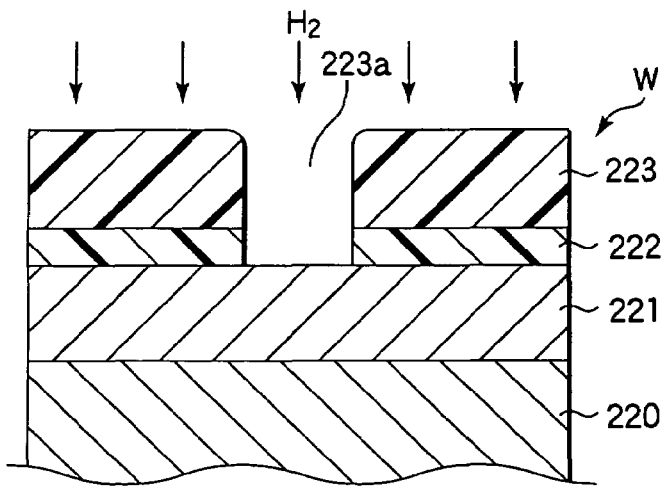
Figure 17C:
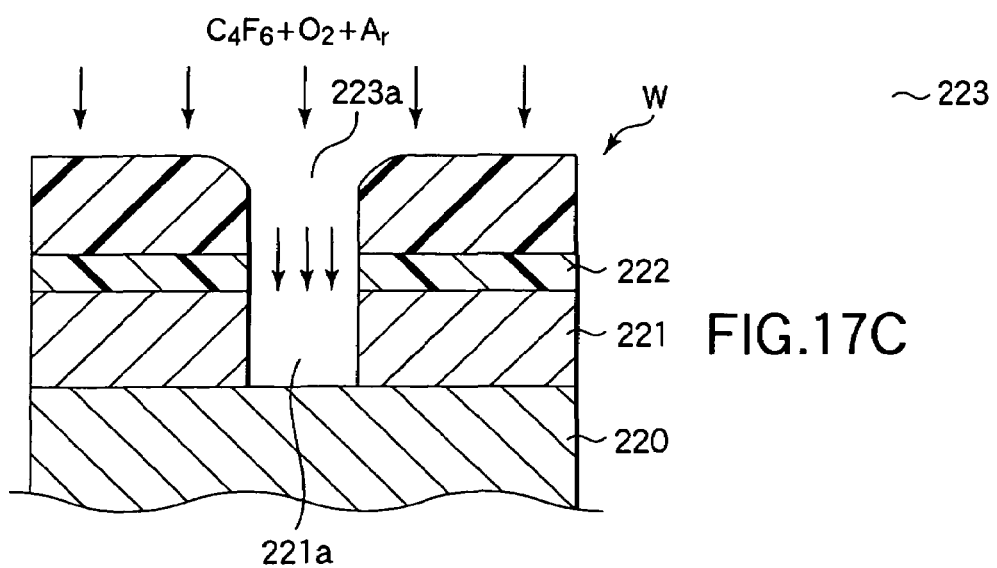

An explanation will be given with reference to FIGS. 17A to 17C.

The ArF photoresist or F2 photoresist constituting the photoresist layer 223 may be made of an alicyclic group-containing acrylate resin, cycloolefin resin, cycloolefin-maleic anhydride resin, methacrylate resin, or the like. As the organic antireflective layer 222, an organic polymeric material may be used.

The gate valve 32 is first opened, and the process subject W is transferred into the process container 2 and placed on the electrostatic chuck 11. Then, the gate valve 32 is closed, and the pressure in the process container 2 is reduced by the exhaust device 35. Then, the valve 28 is opened, and $H_2$ gas is supplied from the process gas supply source 30, thereby setting the pressure in the process container 2 at a predetermined value.

In this state, high-frequency powers are applied from the first and second high-frequency power supplies 40 and 50 to turn $H_2$ into plasma. The plasma acts to modify the photoresist layer 223 so as to improve the plasma resistance of the photoresist layer 223 and, simultaneously, acts to etch the antireflective layer 222 through the opening pattern 223a of the photoresist layer 223 (FIG. 17A). Before or after the timing when the high-frequency powers are applied from the first and second high-frequency power supplies 40 and 50, a DC voltage is applied to the electrode 12 in the electrostatic chuck 11 to electrostatically attract and hold the process subject W on the electrostatic chuck 11. When the etching is performed for a predetermined time, the high-frequency powers and etching gas stop being supplied, so that the etching of the antireflective layer 222 is finished (FIG. 17B). An endpoint detector (not shown) may be used to detect the light intensity of a specific substance in plasma, so that the etching step is finished based thereon.

Then, using the same process container or another process container, an etching gas of, e.g., $C_4F_6$, $O_2$, and Ar is supplied, to plasma-etch the etching objective layer 221 through the opening pattern 223a of the photoresist layer 223, as in the operation of etching the antireflective layer 222. As a consequence, an opening pattern 221a is formed in the etching objective layer 221 (FIG. 17C). After the etching of the etching objective layer 221 is completed, the process subject W is transferred out of the process container 2 through the gate valve 32.

When modifying the photoresist layer 223 by $H_2$ plasma, it is preferable for the density of hydrogen radical (H*) to fall within a range of $4\times10^{12}/cm^3$ to $2\times10^{13}/Cm^3$. If the density of hydrogen radical (H*) is less than $4\times10^{12}/cm^3$, it is difficult to sufficiently modify the photoresist layer 223. It follows that the etching amount of the photoresist layer 223 may become excessively large in etching the etching objective layer 221. On the other hand, if the density of hydrogen radical (H*) exceeds $2\times10^{13}/cm^3$, the modification of the photoresist layer 223 excessively proceeds, with the result that the photoresist layer 223 may suffer some damage so as to cause the etching amount of the photoresist layer 223 to be, if anything, greaten.

In this embodiment, as described above, the hydrogen plasma processing is performed under an appropriate radical density, with the result that it is possible to appropriately modify the photoresist layer 223, as in the aforementioned embodiments. It follows that the antireflective layer 222 and the etching objective layer 221 can be etched under high etching selectivity relative to the photoresist layer 223. Further, the photoresist layer 223 is prevented from suffering surface roughness increase or striation formation even if the photoresist layer 223 is made of a photoresist having a low plasma resistance such as an ArF photoresist or F2 photoresist, thereby improving the accuracy of opening pattern 221a formed in the etching objective layer 221, using the photoresist layer 223 as a mask. Furthermore, the shapes of etched portion are satisfactory because the antireflective layer 222 is etched with the hydrogen plasma having such an appropriate radical density.

In this embodiment, the antireflective layer 222 is not always required. In the case where there is no antireflective layer 222, only the modification process of photoresist layer 223 is performed by $H_2$ plasma. Also in this embodiment, the etching objective portion is not limited. This may be applied to etching of oxide film (oxygen compound) such as TEOS, BPSG, PSG, SOG, thermal oxidation film, HTO, FSG, organic Si oxide film, CORAL (Novellus Systems), low dielectric constant organic insulating film, or the like. Another organic photoresist layer, or another organic layer other than photoresist may be used, in place of a photoresist material having a low plasma resistance, such as an ArF photoresist or F2 photoresist. Also, the structure of the plasma processing apparatus is not limited to that shown in FIG. 1.

Next, an explanation will be given of present example of a method according to the eleventh embodiment.

In this example, a process subject having the structure shown in FIG. 17A was used. More specifically, the process subject was prepared by forming a $SiO_2$ layer with a thickness of 1,500 nm on a Si substrate, followed by forming an organic antireflective layer with a thickness of 60 nm on the $SiO_2$ layer, and forming an ArF photoresist layer on the antireflective layer. Further, after forming the ArF photoresist layer, opening patterns each having a diameter of 0.18 μm were formed in the ArF photoresist layer. There were two types of the opening patterns, namely, dense patterns (Den) and isolated patterns (Iso).

First, the ArF photoresist layer was modified by $H_2$ plasma and the antireflective layer was etched at the same time. The processing time was set for 40 seconds. In this stage, only $H_2$ gas was used as a process gas and the flow rate thereof was varied within a range of 50 to 150 mL/min (50 to 150 sccm). The pressure in the process container was set at 1.34 to 4.02 Pa (10 to 30 mTorr). High-frequency power applied to the upper electrode was varied within a range of 300 to 2200 W. By varying the conditions as just described, the density of H radical (H*) was varied. In the light of detecting limitation of measuring apparatus, in the case of a low density of H radical (H*) in a range of not higher than $4 \times 10^{12}/cm^3$, the radical density was measured by means of vacuum ultraviolet absorption spectroscopy (VUVAS), while in the case of a high density of H radical (H*) in a range of higher than $4 \times 10^{12}/cm^3$, the radical density was measured by means of emission spectroscopy (OES).

Then, the $SiO_2$ layer was etched, using the ArF photoresist layer as a mask. The process time was set for 60 seconds. In this etching, the flow rate of the etching gas $C_4F_6$, Ar, and $O_2$ were respectively set at 25 mL/min (25 sccm), 700 mL/min (700 sccm), and 26 mL/min (26 sccm). The pressure in the process container was set at 2.68 Pa (20 mTorr), and high-frequency powers applied to the upper and lower electrode were set at 1,800 W each. In this etching of $SiO_2$ layer, the etching rate of ArF photoresist layer was measured.

Figure 18:
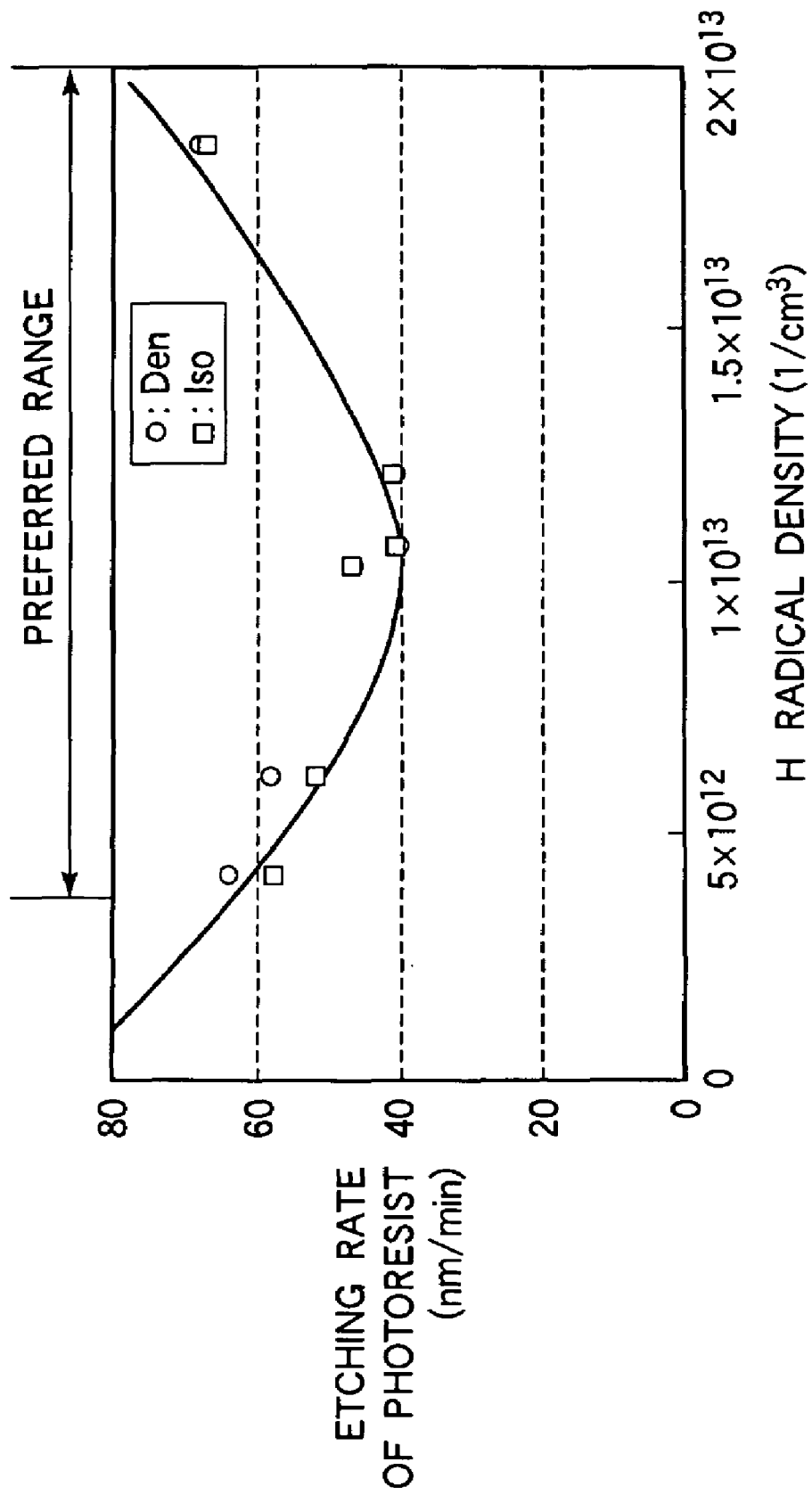
FIG. 18 is a graph showing the relationship between the density of H radical (H*) in the first state of the $H_2$ plasma process and the etching rate of the ArF photoresist layer in the second stage of etching $SiO_2$ layer.

Next, the relationship between the density of H radical (H*) in the first stage of the $H_2$ plasma process and the etching rate of the ArF photoresist layer in the second stage of etching the $SiO_2$ layer was obtained. FIG. 18 shows the result. As shown in FIG. 18, it was found that, where the density of H radical (H*) was less than $4 \times 10^{12}/cm^3$ or higher than $2 \times 10^{13}/cm^3$, the etching rate of the photoresist layer was high and, therefore, the modification effect to the photoresist layer tended not to be provided. On the other hand, it was confirmed that, where the density of H radical (H*) was within a range of $4 \times 10^{12}$ to $2 \times 10^{13}/cm^3$, the etching rate of the photoresist layer can be controlled within a range of 40 to 80 nm/min and, therefore, the modification effect to the photoresist layer can be provided.

What is claimed is:

1. A plasma processing method comprising the steps of:
    placing a process subject in a process container, wherein the process subject has an etching objective layer formed of an insulating film comprising a Si compound, an antireflective layer covering the etching objective layer, and a mask layer covering the antireflective layer and having an opening pattern formed therein;
    supplying a first process gas containing $H_2$ and no carbon elements into the process container;
    turning the first process gas into plasma; and
    performing first etching selectively on the antireflective layer relative to the mask layer by the plasma of the first process gas, through the opening pattern of the mask layer, and
    then performing second etching selectively on the etching objective layer by plasma of a second process gas containing a fluorocarbon, through the opening pattern, inside the process container.

2. The plasma processing method according to claim 1, wherein the process subject is placed on a susceptor disposed in the process container, and, in the first etching, the susceptor is supplied with a high-frequency power having a frequency of 100 MHz or more, and a high-frequency power having a frequency of 3 MHz or more, in a superimposition manner.

3. The plasma processing method according to claim 2, wherein the high-frequency power having a frequency of 3 MHz or more is set at 100 W or less.

4. The plasma processing method according to claim 1, wherein the mask layer is an ArF photoresist layer or F2 photoresist layer.

5. The plasma processing method according to claim 1, wherein the first process gas consists essentially of $H_2$.

6. The plasma processing method according to claim 5, wherein the second etching comprises a step of turning $CF_4$ and $H_2$ into plasma, and etching halfway the etching objective layer through the opening pattern of the mask layer, and a step of turning an etching gas into plasma, and etching a remaining portion of the etching objective layer, following the step of etching halfway.

7. The plasma processing method according to claim 6, wherein the mask layer is an ArF photoresist layer or F2 photoresist layer.

8. The plasma processing method according to claim 6, wherein the mask layer is made of a methacrylate resin.

9. The plasma processing method according to claim 6, wherein the etching gas is a gas other than a mixture gas of $CF_4$ and $H_2$.

10. The plasma processing method according to claim 6, wherein the etching objective layer is an $SiO_2$ layer, and the etching gas is a gas containing $C_5F_8$ and $O_2$.

11. The plasma processing method according to claim 1, wherein the first etching step is performed with a pressure in the process container set at 13.3 Pa (100 mTorr) or less.

12. The plasma processing method according to claim 1, wherein the etching objective layer is an $SiO_2$ layer, and the fluorocarbon of the second etching gas contains $C_4F_6$.

13. The plasma processing method according to claim 1, wherein the etching objective layer is an $SiO_2$ layer, and the fluorocarbon of the second etching gas contains $C_5F_8$.

14. The plasma processing method according to claim 13, wherein the $C_5F_8$ is a straight-chain $C_5F_8$.

15. The plasma processing method according to claim 14, wherein the straight-chain $C_5F_8$ is 1,1,1,4,4,5,5,5-octafluoro-2-pentyne.

16. The plasma processing method according to claim 13, wherein the first process gas contains $N_2$ and $H_2$, and the first etching step is performed with a pressure in the process container set at 107 to 160 Pa (800 to 1,200 mTorr).

17. A plasma processing method comprising the steps of:
    placing a process subject in a process container, wherein the process subject has an etching objective layer formed of an insulating film comprising an Si compound, and an organic mask layer covering the etching objective layer and having an opening pattern formed therein, and the process container includes a counter electrode with an exposed portion made of a substance having Si;
    supplying a process gas of one or more selected from the group consisting of $H_2$, $N_2$, and He into the process container;
    turning the process gas into plasma, and plasma-processing the organic mask layer to cause Si supplied from the counter electrode to react with C or H on a surface of the organic mask layer, thereby forming a thin protection layer containing Si—C or SiO on the organic mask layer; and
    then performing etching selectively on the etching objective layer by plasma of an etching gas containing a fluorocarbon, through the opening pattern, inside the process container.

18. The plasma processing method according to claim 17, further comprising a step of etching the etching objective layer after the plasma process step.

19. The plasma processing method according to claim 17, wherein the organic mask layer is an organic photoresist layer.

20. The plasma processing method according to claim 19, wherein the organic photoresist layer is made of an ArF photoresist or F2 photoresist.

21. The plasma processing method according to claim 17, wherein the substance having Si is single-crystalline Si.

22. The plasma processing method according to claim 17, wherein the substance having Si is SiC.

23. The plasma processing method according to claim 17, wherein an organic film covering the etching objective layer is interposed between the etching objective layer and the organic mask layer.

24. The plasma processing method according to claim 23, wherein the etching gas contains $CF_4$.

25. The plasma processing method according to claim 23, wherein the organic film is an organic antireflective film.

26. A plasma processing method comprising the steps of:
placing a process subject in a process container, wherein the process subject has an etching objective layer formed of an insulating film comprising a Si compound, an antireflective layer covering the etching objective layer, and a mask layer covering the antireflective layer and having an opening pattern formed therein;
supplying a first etching gas containing $C_2F_4$ and $O_2$ into the process container accommodating the process subject;
turning the first etching gas into plasma; and
etching the antireflective layer by the plasma of the first etching gas through the opening pattern of the mask layer,
then etching the etching objective layer by plasma of a second etching gas differing from the first etching gas and containing a fluorocarbon, inside the process container.

27. The plasma processing method according to claim 26, wherein the mask layer is a photoresist layer.

28. The plasma processing method according to claim 27, wherein the photoresist layer is made of an ArF photoresist or F2 photoresist.

29. The plasma processing method according to claim 26, wherein the antireflective layer is a carbon-containing layer.

30. The plasma processing method according to claim 26, wherein the antireflective layer is an organic layer.

31. A plasma processing method comprising the steps of:
placing a process subject in a process container, wherein the process subject has an etching objective layer formed of an insulating film comprising Si compound, an antireflective layer covering the etching objective, and a photoresist layer made of an ArF photoresist or F2 photoresist, covering the antireflective layer, and having an opening pattern formed therein;
turning a first etching gas containing a substance having C and F and a substance having H into plasma in the process container, and etching the antireflective layer through the opening pattern; and
then etching the etching objective layer by plasma of a second etching gas different from the first etching gas and containing a fluorocarbon, inside the process container.

32. The plasma processing method according to claim 31, wherein the substance having H is a hydrocarbon.

33. The plasma processing method according to claim 32, wherein the hydrocarbon is $CH_4$.

34. The plasma processing method according to claim 31, wherein the substance having H is $H_2$.

35. The plasma processing method according to claim 31, wherein the substance having H is a hydrofluorocarbon.

36. The plasma processing method according to claim 35, wherein the number of H atoms relative to the number of F atoms is three or more in the hydrofluorocarbon.

37. The plasma processing method according to claim 36, wherein the hydrofluorocarbon is $CH_3F$.

38. The plasma processing method according to claim 37, wherein a ratio of a flow rate of the $CH_3F$ relative to a flow rate of the substance having C and F is set at 0.04 to 0.07 in the first etching gas.

39. The plasma processing method according to claim 31, wherein the substance having C and F is $CF_4$.

40. The plasma processing method according to claim 31, wherein the substance having C and F is $CF_4$.

41. A plasma processing method comprising the steps of:
placing a process subject in a process container, wherein the process subject has an etching objective layer formed of an insulating film comprising an Si compound, an antireflective layer covering the etching objective layer, and a photoresist layer made of an ArF photoresist or F2 photoresist, covering the antireflective layer, and having an opening pattern formed therein;
turning a process gas containing a substance having C and F, and CO into plasma in the process container, and irradiating the photoresist layer with the plasma;
turning a first etching gas into plasma in the process container, and etching the antireflective layer by the plasma of the first etching gas through the opening pattern; and
then etching the etching the etching objective layer by plasma of a second etching gas different from the first etching gas and containing a fluorocarbon, inside the process container.

42. The plasma processing method according to claim 41, wherein the substance having C and F is $CF_4$.

43. The plasma processing method according to claim 41, wherein the process gas and the first etching gas are the same gas.

44. The plasma processing method according to claim 41, wherein the etching objective layer is an $SiO_2$ layer, and the second etching gas contains $C_5F_8$.

45. The plasma processing method according to claim 41, wherein the etching objective layer is an $SiO_2$ layer, and the second etching gas contains $C_4F_6$.

46. A plasma processing method comprising the steps of:
placing a process subject in a process container, wherein the process subject has an etching objective layer formed of an insulating film comprising Si compound, an organic antireflective layer covering the etching objective layer, and a photoresist layer made of an ArF photoresist or F2 photoresist, covering the organic antireflective layer, and having an opening pattern formed therein;
turning a first etching gas containing a substance having Si into plasma in the process container, and etching the antireflective layer through the opening pattern and forming a thin film containing Si on a surface of the photoresist layer, by the plasma of the first etching gas; and
then etching the etching objective layer by plasma of a second etching gas different from the first etching gas and containing a fluorocarbon, inside the process container.

47. The plasma processing method according to claim 46, wherein the substance having Si is $SiF_4$.

48. The plasma processing method according to claim 47, wherein the first etching gas contains $CHF_3$.

49. The plasma processing method according to claim 47, wherein the first etching gas contains HBr.

50. The plasma processing method according to claim 47, wherein the first etching gas contains He.

51. The plasma processing method according to claim 47, wherein the first etching gas contains $H_2$.

52. A plasma processing method comprising the steps of:
placing a process subject on a susceptor disposed in a process container including a component member with an exposed portion made of a substance including Si, wherein the process subject has an etching objective layer, and a mask layer covering the etching objective layer and having an opening pattern formed therein;
supplying an inert gas into the process container in a state where the process subject is present in the process container;
supplying the process container with high-frequency energy to ionize at least a part of the inert gas, thereby sputtering the component member to provide a material and forming a film containing Si from the material on a surface of the mask layer;
supplying an etching gas into the process container;
turning the etching gas into plasma; and
etching the etching objective layer by the plasma of the etching gas through the opening pattern of the mask layer in the process container.

53. The plasma processing method according to claim 52, wherein the mask layer is an ArF photoresist layer or F2 photoresist layer.

54. The plasma processing method according to claim 52, wherein the component member is a focus ring disposed around the process subject.

55. The plasma processing method according to claim 52, wherein the component member is a showerhead disposed to supply the etching gas into the process container.

56. The plasma processing method according to claim 52, wherein the etching objective layer consists of Si oxide, and the etching gas contains at least one compound selected from the group consisting of $C_4F_6$, $C_4F_8$, and $C_5F_8$.

57. The plasma processing method according to claim 52, further comprising a step of plasma-removing the mask layer by a plurality of stages, after the etching step.

58. The plasma processing method according to claim 57, wherein the step of plasma-removing the mask layer by a plurality of stages comprises a first removing step of removing a part of the mask layer by plasma of a gas containing a fluorine compound, and a second removing step of removing at least a part of the mask layer left by the first removing step, by plasma of a gas containing no fluorine compound.

59. The plasma processing method according to claim 58, wherein the mask layer is an ArF photoresist layer or F2 photoresist, and the gas used in the first removing step is $CF_4$.

60. The plasma processing method according to claim 52, wherein the step of supplying the process container with energy comprises application of a high-frequency power to an antenna disposed outside the process container.

61. The plasma processing method according to claim 52, wherein the step of supplying the process container with energy comprises application of a high-frequency power to a counter electrode disposed in the process container to face the susceptor.

62. A plasma processing method comprising the steps of:
preparing a process container such that a component member having a surface at least a part of which is made of Si, a first electrode, and a second electrode facing the first electrode are disposed in the process container;
placing a process subject on the first electrode disposed in the process container, wherein the process subject has an etching objective layer, and a mask layer covering the etching objective layer and having an opening pattern formed therein;
supplying an inert gas into the process container;
supplying the process container with high-frequency energy to ionize at least a part of the inert gas, thereby sputtering the component member to provide a material and forming a film containing Si from the material on a surface of the mask layer;
applying a high-frequency power to the first electrode;
applying a high-frequency power to the second electrode;
supplying an etching gas into the process container; and
etching the etching objective layer by the etching gas turned into plasma by the high-frequency powers through the opening pattern of the mask layer in the process container.

63. The plasma processing method according to claim 62, wherein component member is an electrode plate of the second electrode.

64. The plasma processing method according to claim 62, further comprising a step of plasma-removing the mask layer by a plurality of stages after the plasma etching step.

65. The plasma processing method according to claim 17, wherein the process gas is $H_2$ gas.

66. A plasma processing method comprising the steps of:
placing a process subject on a susceptor disposed in a process container, wherein the process subject has an etching objective layer, and a mask layer covering the etching objective layer and having an opening pattern formed therein;
supplying an inert gas into the process container in a state where the process subject and a member having a surface at least a part of which is made of Si are present in the process container;
supplying the process container with high-frequency energy to ionize at least a part of the inert gas;
supplying an etching gas into the process container;
turning the etching gas into plasma; and
etching the etching objective layer by the plasma of the etching gas through the opening pattern of the mask layer in the process container,
wherein the member having a surface at least a part of which is made of Si is a focus ring disposed around the process subject.

* * * * *